(12) United States Patent
Lin et al.

(10) Patent No.: US 10,888,001 B2
(45) Date of Patent: *Jan. 5, 2021

(54) CIRCUIT CARRIER BOARD STRUCTURE AND MANUFACTURING METHOD THEREOF

(71) Applicant: Unimicron Technology Corp., Taoyuan (TW)

(72) Inventors: Wei-Ti Lin, Hsinchu County (TW); Chun-Hsien Chien, Hsinchu (TW); Chien-Chou Chen, Hsinchu County (TW); Fu-Yang Chen, Hsinchu County (TW); Ra-Min Tain, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/244,113

(22) Filed: Jan. 10, 2019

(65) Prior Publication Data

US 2019/0380210 A1 Dec. 12, 2019

Related U.S. Application Data

(60) Provisional application No. 62/682,181, filed on Jun. 8, 2018.

(30) Foreign Application Priority Data

Oct. 18, 2018 (TW) .............................. 107136704 A

(51) Int. Cl.
*H05K 7/10* (2006.01)
*H05K 3/46* (2006.01)
(Continued)

(52) U.S. Cl.
CPC ........... *H05K 3/4644* (2013.01); *H05K 1/111* (2013.01); *H05K 1/115* (2013.01); *H05K 1/181* (2013.01);
(Continued)

(58) Field of Classification Search
USPC .......................................................... 361/767
See application file for complete search history.

(56) References Cited

U.S. PATENT DOCUMENTS 8,916,981 B2 12/2014 Xiu et al.
9,307,641 B2 4/2016 Oi et al.
(Continued)

FOREIGN PATENT DOCUMENTS

| CN | 104658919 | 5/2015 |
|----|-----------|--------|
| TW | I599008 | 9/2017 |
| TW | 201844065 | 12/2018 |

OTHER PUBLICATIONS

"Office Action of Taiwan Counterpart Application," dated Dec. 13, 2019, p. 1-p. 5.
(Continued)

*Primary Examiner* — Andargie M Aychillhum
(74) *Attorney, Agent, or Firm* — JCIPRNET

(57) ABSTRACT

A circuit carrier board structure includes a first substrate, a second substrate, an adhesive layer, and a plurality of contact pads. The first substrate includes a first surface and a second surface, and also includes a plurality of first build-up layers sequentially stacked. The first build-up layers include a first dielectric layer and a first circuit layer. The second substrate includes a third surface and a fourth surface, and also includes a plurality of second build-up layers sequentially stacked. The second build-up layers include a second dielectric layer and a second circuit layer. The second surface is combined to the third surface. The
(Continued)

connection pads are on the first surface and electrically connected to the first circuit layer. The first substrate is electrically connected to the second substrate. A manufacturing method of the circuit carrier board structure is also provided.

12 Claims, 20 Drawing Sheets

(51) Int. Cl.
- *H05K 3/40* (2006.01)
- *H05K 3/42* (2006.01)
- *H05K 3/28* (2006.01)
- *H05K 3/30* (2006.01)
- *H05K 1/11* (2006.01)
- *H05K 1/18* (2006.01)
- *H05K 3/00* (2006.01)

(52) U.S. Cl.
CPC ............ *H05K 3/007* (2013.01); *H05K 3/0097* (2013.01); *H05K 3/28* (2013.01); *H05K 3/303* (2013.01); *H05K 3/4007* (2013.01); *H05K 3/421* (2013.01); *H05K 3/429* (2013.01); H05K 2201/09136 (2013.01); H05K 2201/09509 (2013.01); H05K 2201/09827 (2013.01); H05K 2201/10234 (2013.01); H05K 2201/10522 (2013.01)

(56) References Cited

U.S. PATENT DOCUMENTS

| | | |
|---|---|---|
| 9,412,687 B2 | 8/2016 | Kunimoto et al. |
| 2006/0272853 A1* | 12/2006 | Muramatsu .......... H05K 1/0231 174/262 |

OTHER PUBLICATIONS

"Office Action of Taiwan Related Application, application No. 108115660", dated Mar. 9, 2020, pp. 1-5.
"Office Action of China Counterpart Application", dated Sep. 3, 2020, p. 1-p. 7.

* cited by examiner

CIRCUIT CARRIER BOARD STRUCTURE AND MANUFACTURING METHOD THEREOF

CROSS-REFERENCE TO RELATED APPLICATION

This application claims the priority benefits of U.S. provisional application Ser. No. 62/682,181, filed on Jun. 8, 2018, and Taiwan application serial no. 107136704, filed on Oct. 18, 2018. The entirety of each of the above-mentioned patent applications is hereby incorporated by reference herein and made a part of this specification.

BACKGROUND OF THE INVENTION

Field of the Invention

The invention is related to a carrier board structure and a manufacturing method thereof, and more particularly, to a circuit carrier board structure and a manufacturing method thereof.

Description of Related Art

In general, the multilayer circuit structure of a circuit board is mostly manufactured by a build-up method or a laminated method, and thus has the features of high circuit density and reduced circuit spacing. For example, the multilayer circuit structure is formed by combining a copper foil and a PrePreg into a build-up layer structure and stacking the build-up layer structure on a core layer via repeated lamination to increase the internal wiring space of the multilayer circuit structure, wherein the conductive material on the build-up layer structure may form conductive circuits according to the required circuit layout, and the blind vias or through-holes of the build-up layer structure may be additionally filled with a conductive material to conduct each of the layers. Thus, the multilayer circuit structure may be manufactured by adjusting the number of circuit structures according to requirements and via the above method.

With the advancement of technology, all kinds of electronic products are developed to have high speed, high efficiency, and be compact. Under this trend, the number of layers of the multilayer circuit structure has also increased to accommodate more complex electronic product designs. However, as the number of layers of the multilayer circuit structure increases, the warpage issue of the multilayer circuit structure becomes more significant. In addition, the manufacturing process of the multilayer circuit structure is complicated, thus increasing the difficulty of the ultrafine circuit manufacturing process, such that cost cannot be reduced and the issue of poor production yield occurs.

SUMMARY OF THE INVENTION

The invention provides a circuit carrier board structure and a manufacturing method thereof that may alleviate the warpage issue of the circuit carrier board structure, reduce manufacturing difficulty and manufacturing cost, improve production yield, and have good quality.

A manufacturing method of a circuit carrier board structure of the invention includes the following steps. A temporary carrier board is provided. A first substrate is formed on the temporary carrier board, wherein the first substrate has a first surface and a second surface opposite to the first surface. A second substrate is provided, wherein the second substrate has a third surface and a fourth surface opposite to the third surface. An adhesive layer is disposed on one of the first substrate and the second substrate, and the adhesive layer is located between the first substrate and the second substrate. The second surface of the first substrate is combined to the third surface of the second substrate. The temporary carrier board is removed, wherein the first substrate is electrically connected to the second substrate.

In an embodiment of the invention, the step of forming the first substrate includes forming a release layer on the temporary carrier board, and forming a plurality of first build-up layers, wherein the first build-up layers are sequentially stacked on the release layer. Each of the first build-up layers includes a first dielectric layer and a first circuit layer. The first build-up layers are electrically connected to one another.

In an embodiment of the invention, the step of providing the second substrate includes providing a second base, and forming a plurality of second build-up layers, wherein the second build-up layers are sequentially stacked on the second base. Each of the second build-up layers includes a second dielectric layer and a second circuit layer. A plurality of conductive pads are formed on the third surface, and the conductive pads are electrically connected to the second circuit layer. The second build-up layers are electrically connected to one another.

In an embodiment of the invention, the manufacturing method further includes the following steps. A plurality of through-holes are formed, wherein the through-holes pass through the first substrate and expose the conductive pads. A seed layer is formed on the first surface, wherein the seed layer is filled in the through-holes and in contact with the conductive pads. A photoresist pattern is formed, wherein the photoresist pattern covers a portion of the seed layer to expose a portion of the seed layer. A plurality of conductive structures are formed from the exposed portion of the seed layer, wherein each of the conductive structures is electrically connected to each of the conductive pads and the first circuit layer. The photoresist pattern and the seed layer covered by the photoresist pattern are removed.

In an embodiment of the invention, the step of forming the first substrate further includes forming a plurality of conductive pillars on the second surface, wherein the conductive pillars are electrically connected to the first circuit layer.

In an embodiment of the invention, the step of providing the second substrate includes providing a second base. A plurality of second build-up layers are formed, wherein the second build-up layers are sequentially stacked on the second base, and each of the second build-up layers includes a second dielectric layer and a second circuit layer. A plurality of conductive blind vias are formed on the third surface, and the conductive blind vias are electrically connected to the second circuit layer. The second build-up layers are electrically connected to one another.

In an embodiment of the invention, the step of combining the first substrate to the second substrate further includes combining the conductive pillars to the conductive blind vias such that the conductive pillars are electrically connected and filled in the conductive blind vias to form the conductive structures. The conductive structures are electrically connected to the second circuit layer and the first circuit layer.

In an embodiment of the invention, the manufacturing method further includes forming a plurality of connection pads on the first surface, and the connection pads are electrically connected to the first circuit layer, wherein the linewidth of the first circuit layer is smaller than the linewidth of each of the connection pads. A solder resist layer is formed, wherein the solder resist layer covers the first surface and the fourth surface, and the solder resist layer exposes a portion of the connection pads, the first circuit layer, and the second circuit layer. Moreover, a surface treatment procedure is performed.

In an embodiment of the invention, the manufacturing method further includes the following steps. A plurality of electronic elements are disposed on the first surface of the first substrate, and the electronic elements are electrically connected to the connection pads and the first circuit layer. Moreover, a plurality of solder balls are disposed on the solder resist layer, wherein the solder balls are electrically connected to the second circuit layer.

A circuit carrier board structure of the invention includes a first substrate, a second substrate, an adhesive layer, and a plurality of connection pads. The first substrate has a first surface and a second surface opposite to the first surface. The first substrate includes a plurality of first build-up layers that are sequentially stacked, each of the first build-up layers includes a first dielectric layer and a first circuit layer, and the first build-up layers are electrically connected to one another. The second substrate has a third surface and a fourth surface opposite to the third surface. The second substrate includes a plurality of second build-up layers that are sequentially stacked, each of the second build-up layers includes a second dielectric layer and a second circuit layer, and the second build-up layers are electrically connected to one another. The adhesive layer is located between the first substrate and the second substrate. The second surface is combined to the third surface. The connection pads are located on the first surface and electrically connected to the first circuit layer. The first substrate is electrically connected to the second substrate. The linewidth of the first circuit layer is smaller than the linewidth of each of the connection pads, and the linewidth of the first circuit layer is less than or equal to 10 microns.

In an embodiment of the invention, the first substrate further includes a plurality of through-holes passing through the first substrate. The second substrate further includes a second base, the second build-up layers are disposed on the second base, and the plurality of conductive pads are located on the third surface and electrically connected to the second circuit layer. The through-holes expose the conductive pads, and the conductive pads are filled in the through-holes and electrically connected to the connection pads, the conductive pads, the first circuit layer, and the second circuit layer.

In an embodiment of the invention, the top surface of each of the conductive structures is adjacent to the first surface, the bottom surface of each of the conductive structures is adjacent to the second surface, and the diameter of the top surface of each of the conductive structures is greater than the diameter of the bottom surface of each of the conductive structures. The top surface of the first circuit layer is adjacent to the second surface, the bottom surface of the first circuit layer is adjacent to the first surface, and the diameter of the top surface of the first circuit layer is greater than the diameter of the bottom surface of the first circuit layer.

In an embodiment of the invention, the first substrate further includes a plurality of conductive pillars located on the second surface and electrically connected to the first circuit layer. The second substrate further includes a second base, the second build-up layers are disposed on the second base, and the plurality of conductive blind vias are located on the third surface and electrically connected to the second circuit layer. The conductive pillars are filled in the conductive blind vias to form a plurality of conductive structures, and the conductive structures are electrically connected to the first circuit layer and the second circuit layer.

In an embodiment of the invention, the circuit carrier board structure further includes a solder resist layer covering the first surface and the fourth surface. The solder resist layer exposes a portion of the connection pads, the first circuit layer, and the second circuit layer.

In an embodiment of the invention, the circuit carrier board structure further includes a plurality of electronic elements located on a first surface of the first substrate and a plurality of solder balls electrically connected to the second circuit layer. The electronic elements are electrically connected to the connection pads and the first circuit layer.

Based on the above, in the circuit carrier board structure and the manufacturing method thereof of the invention, the plurality of first build-up layers and second build-up layers are respectively disposed in the first substrate and the second substrate. Therefore, the number of build-up layers formed on the same substrate may be reduced, the warpage issue caused by the manufacture of the plurality of build-up layers may be alleviated, manufacturing difficulty and manufacturing cost may be reduced, and production yield may be increased. In addition, the circuit carrier board structure of the invention may further be electrically connected to the first substrate and the second substrate via the conductive structures and the connection pads. As a result, the circuit carrier board structure may achieve the requirement of fine contact bonding with the electronic elements without an additional interconnection structure, and may be further electrically connected to the second substrate via the first substrate comprehensively disposed on the second substrate and the conductive structures disposed in the first substrate. Therefore, the wiring margin of the circuit carrier board structure may be greatly improved, and the signal integrity of the signal transmission between the plurality of electronic elements may also be improved, such that the circuit carrier board structure has good quality.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
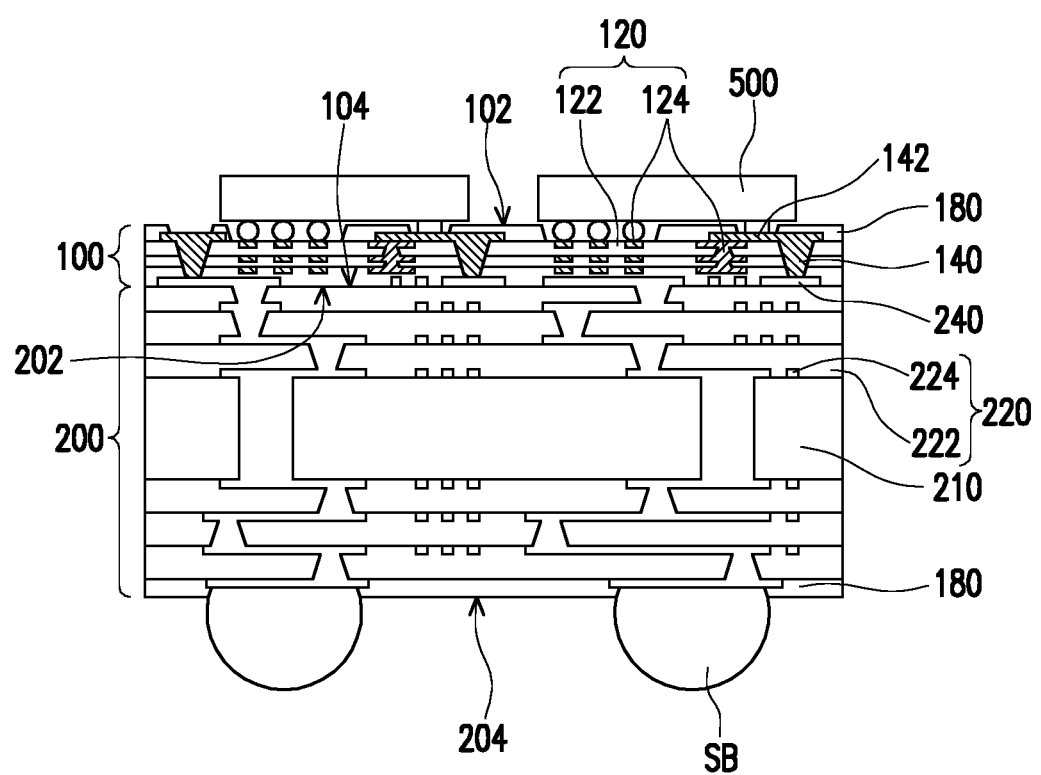
FIG. 1 is a cross-sectional view of a circuit carrier board structure of an embodiment of the invention.

Some embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference numerals.

Moreover, terms such as "first" and "second" used herein do not represent order, and it should be understood that they are for differentiating devices or operations having the same technical terms.

Secondly, the terms "containing", "including", "having" and the like as used herein are all open terms; i.e., including but not limited to.

Furthermore, the terms "in contact with", "connected to", "bonded to" and the like, as used herein, may mean direct contact or indirect contact via other layers unless otherwise stated.

FIG. 1 is a cross-sectional view of a circuit carrier board structure of an embodiment of the invention. Referring to FIG. 1, in the present embodiment, a circuit carrier board structure 1 includes a first substrate 100 having a first surface 102 and a second surface 104 opposite to the first surface 102, a second substrate 200 having a third surface 202 and a fourth surface 204 opposite to the third surface 202, an adhesive layer 170 located between the first surface 102 of the first substrate 100 and the third surface 202 of the second substrate 200, and a plurality of connection pads 142 located on the first surface 102. The first substrate 100 includes a plurality of first build-up layers 120 sequentially stacked, and each of the first build-up layers 120 includes a first dielectric layer 122 and a first circuit layer 124. The first build-up layers 120 are electrically connected to one another. The second substrate 200 includes a plurality of second build-up layers 220 sequentially stacked, each of the second build-up layers 220 includes a second dielectric layer 222 and a second circuit layer 224, and the second build-up layers 220 are electrically connected to one another. For example, the second substrate 200 further includes a second base 210, and the second build-up layers 220 are disposed on the second base 210. The plurality of connection pads 142 are electrically connected to the first circuit layer 124. The first substrate 100 is electrically connected to the second substrate 200.

In the present embodiment, the circuit carrier board structure 1 further includes a solder resist layer 180 covering the first surface 102 and the fourth surface 204, and the solder resist layer 180 exposes a portion of the connection pads 142, the first circuit layer 124, and the second circuit layer 224. The circuit carrier board structure 1 further includes a plurality of electronic elements 500 located on the first surface 102 of the first substrate 100 and a plurality of solder balls SB electrically connected to the second circuit layer 224. The electronic elements 500 are electrically connected to the connection pads 142 and the first circuit layer 124. The manufacturing method of the circuit carrier board structure 1 is described below with an embodiment.

FIG. 2A to FIG. 2D are cross-sectional views of a manufacturing process of a first substrate of an embodiment of the invention. Referring to FIG. 2A to FIG. 2D, the manufacturing method of the circuit carrier board structure 1 includes the following steps. First, a temporary carrier board 110 is provided, and then a first substrate 100 is formed on the temporary carrier board 110. In the present embodiment, the first substrate 100 has a first surface 102 and a second surface 104 opposite to the first surface 102 (shown in FIG. 2D).

In the present embodiment, the method of forming the first substrate 100 includes the following steps. Referring again to FIG. 2A, a release layer 130 is formed on the temporary carrier board 110. In the present embodiment, the temporary carrier board 110 may be a glass substrate, a Si substrate, a ceramic substrate, or a combination thereof, and the invention is not limited thereto. The release layer 130 may be a photo-curable release film or a thermal curable release film, but the invention is not limited thereto. The viscosity of the photo-curable release film is reduced by a photo-curing process; and the viscosity of the thermal curable release film is reduced by a thermal-curing process. In other embodiments, the release layer 130 may also be a laser debond release film.

Figure 2A:
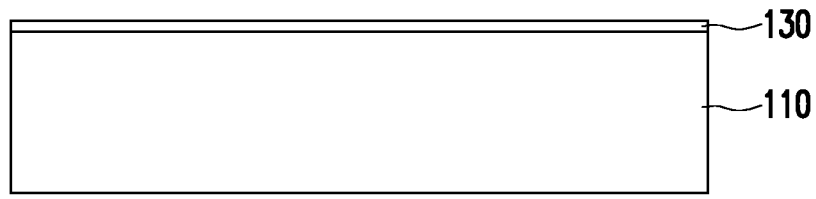
FIG. 2A to FIG. 2D are cross-sectional views of a manufacturing process of a first substrate of an embodiment of the invention.
Figure 2B:
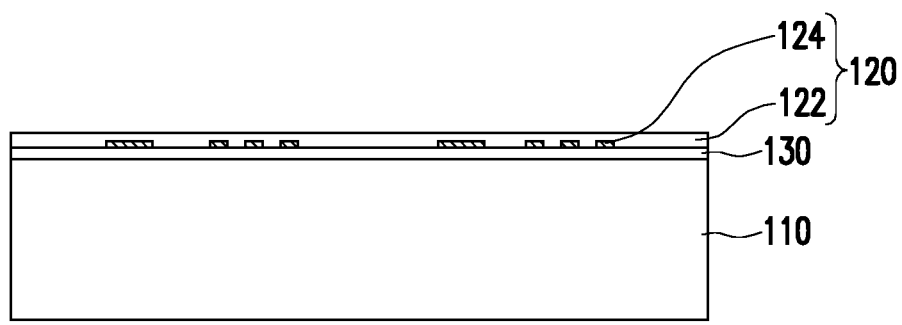
Figure 2C:
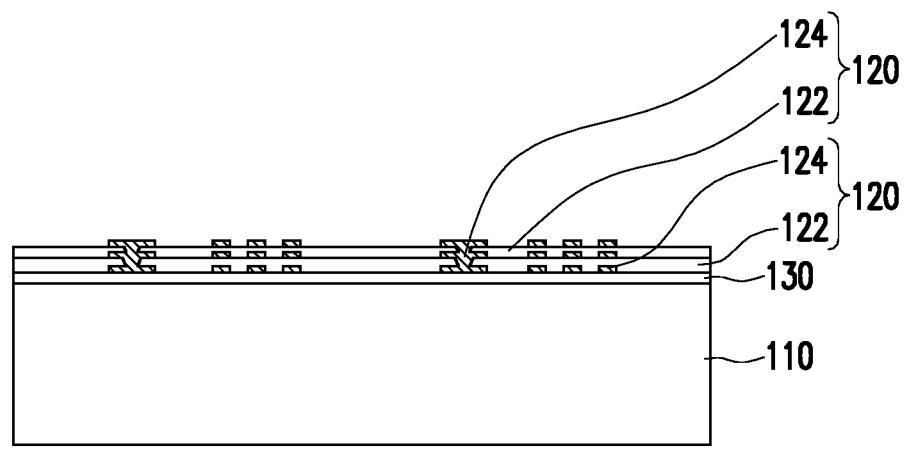
Figure 2D:
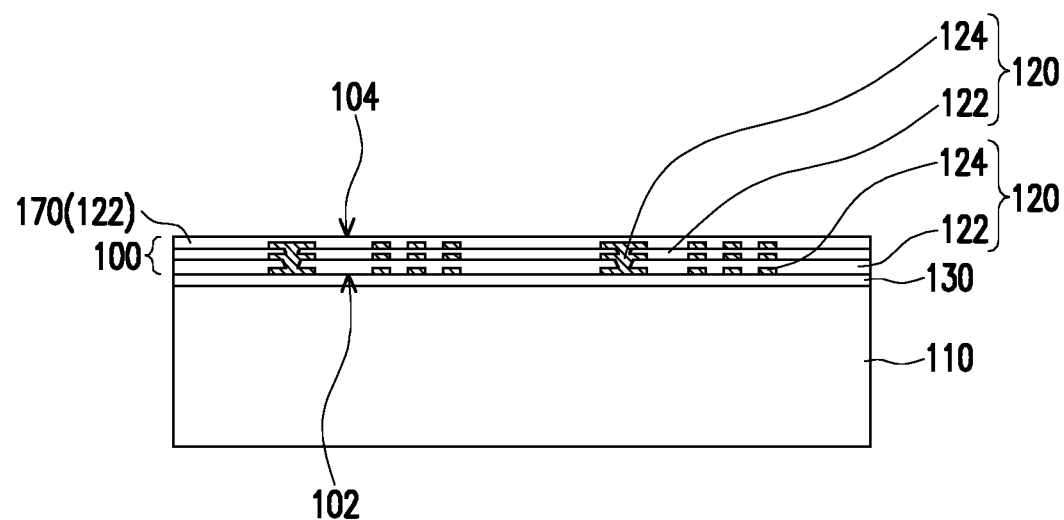

Next, referring to FIG. 2B, FIG. 2C, and FIG. 2D, a plating process is performed to form a plurality of first build-up layers 120 sequentially stacked on the release layer 130. In the present embodiment, the first build-up layers 120 include a first dielectric layer 122 and a first circuit layer 124. For example, the first circuit layer 124 is embedded in the first dielectric layer 122, but the invention is not limited thereto. In the present embodiment, as shown in FIG. 2B, one layer of the first build-up layer 120 is first disposed on the release layer 130. Next, referring to FIG. 2C and FIG. 2D, a plurality of first build-up layers 120 are sequentially combined and stacked on the first build-up layer 120. As shown in FIG. 2D, the first substrate 100 of the present embodiment is exemplified by a stack of three first build-up layers 120, but the invention is not limited thereto. In other embodiments, the number of the first build-up layers 120 may be single or multiple layers, depending on the needs of the user.

After the step of forming the first substrate 100, an adhesive layer 170 is next disposed on the first substrate 100. In the present embodiment, the adhesive layer 170 is disposed, for example, as the first dielectric layer 122 in the first build-up layers 120. In other words, the adhesive layer and the dielectric layer are, for example, the same material. Therefore, in the subsequent combination process, the first substrate 100 and the second substrate 200 may be directly combined without the step of providing the adhesive material, thereby simplifying the process. In the present embodiment, the second surface 104 of the adhesive layer 170 (e.g., the outermost first dielectric layer 122) is combined to the third surface 202 of the second substrate 200. The material of the adhesive layer 170 includes a dielectric material selecting from one of a PrePreg, a flame-resistant glass fiber (FR4), a resin-coated cooper foil, an Ajinomoto Build-up (ABF) film, an adhesive, a solder resist material, and a photosensitive dielectric material.

However, the invention is not limited thereto.

In the present embodiment, the first substrate 100 is, for example, a redistribution layer (RDL), and the first circuit layer 124 of each of the first build-up layers 120 may be applied as a redistribution circuit, but the invention is not limited thereto. In the present embodiment, the first circuit layer 124 is provided by an ultrafine circuit process having a linewidth of less than or equal to 10 microns, but the invention is not limited thereto. The first build-up layers 120 are electrically connected to one another. In the present embodiment, the material of the first circuit layer 124 includes a metal material, which may be, for example, copper or the like. The material of the first dielectric layer 122 includes a dielectric material. The dielectric material is, for example, a PrePreg, a photoimageable dielectric (PID), a photosensitive polymer (for example, benzocyclobutene), an ABF film, a resin-coated cooper foil (RCC), a glass fiber resin composite material, or a combination thereof, and the invention is not limited thereto.

FIG. 3A to FIG. 3E are cross-sectional views of a manufacturing process of a second substrate of an embodiment of the invention. Next, referring to FIG. 3A to FIG. 3E, a second substrate 200 is provided. The second substrate 200 has a third surface 202 and a fourth surface 204 opposite to the third surface 202 (shown in FIG. 3E). The second substrate 200 of the present embodiment is exemplified by a high-density interconnect (HDI), but the invention is not limited thereto. In other embodiments, the second substrate 200 may also be a coreless substrate, a printed circuit board (PCB), or an any-layer PCB.

In the present embodiment, the method of providing the second substrate 200 includes the following steps. Referring again to FIG. 3A, a second base 210 is first provided. The second base 210 includes a core substrate or a coreless substrate. In the present embodiment, the second base 210 may be an insulating substrate, a glass substrate, or a combination thereof, and the invention is not limited thereto. In other embodiments, the second base 210 may also be a PrePreg or other suitable dielectric materials.

In the present embodiment, a photoresist pattern (not labeled) may be optionally disposed on the second base 210 to form a plurality of openings (not labeled) passing through the second base 210 in the second substrate 210, but the invention is not limited thereto. In other embodiments, the openings may also be formed by mechanical drilling, laser drilling, or other suitable methods.

Figure 3A:
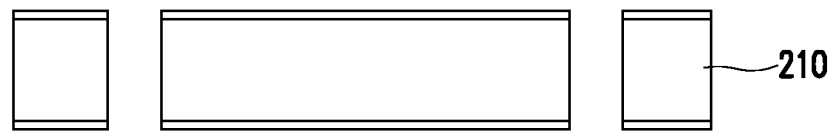
FIG. 3A to FIG. 3E are cross-sectional views of a manufacturing process of a second substrate of an embodiment of the invention.
Figure 3B:
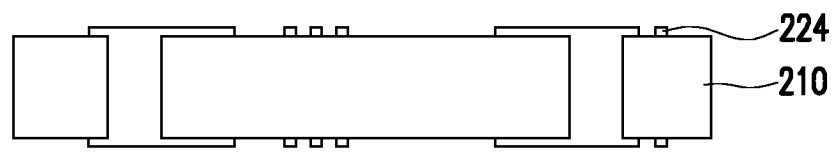
Figure 3C:
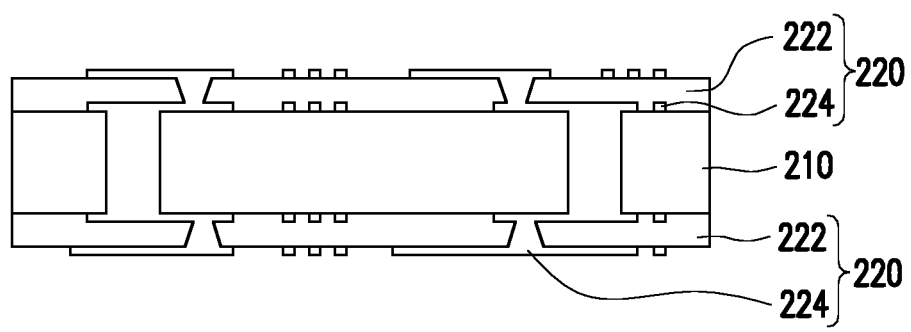
Figure 3D:
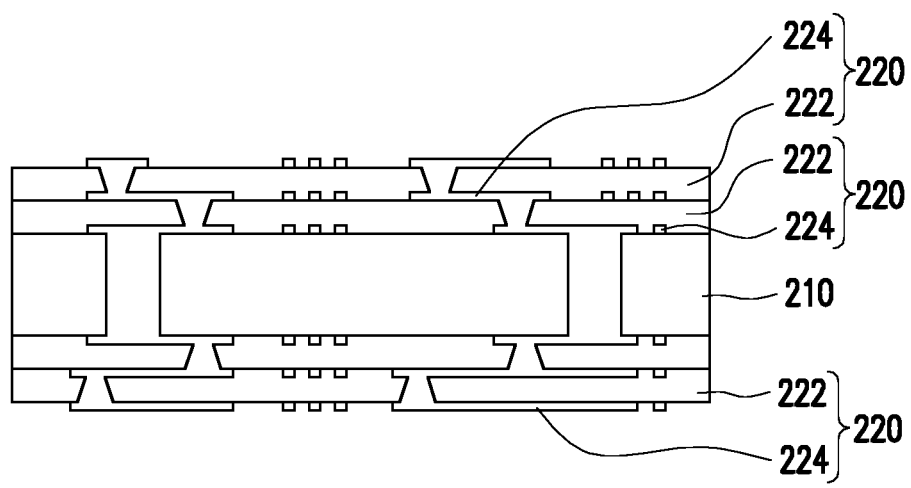
Figure 3E:
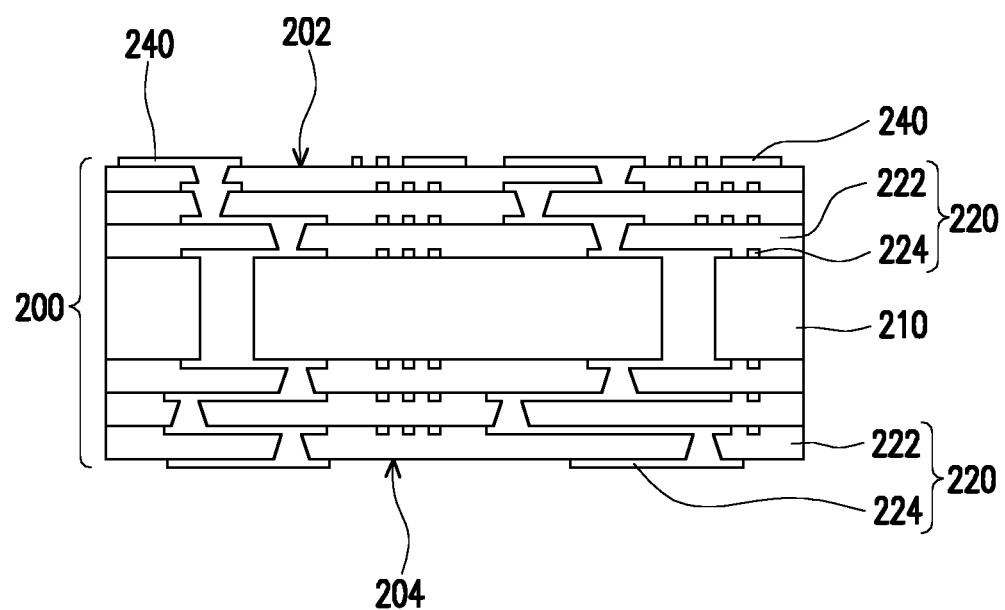

Next, a plating process is performed to respectively form a plurality of second build-up layers 220 sequentially stacked on two opposite surfaces of the second base 210. In the present embodiment, the second build-up layers 220 include a second dielectric layer 222 and a second circuit layer 224. For example, the second circuit layer 224 is embedded in the second dielectric layer 222, but the invention is not limited thereto. In the present embodiment, as shown in FIG. 3C, one layer of the second build-up layer 220 is first disposed on the second base 210. Next, referring to FIG. 3C and FIG. 3D, a plurality of second build-up layers 220 are sequentially combined and stacked on the second build-up layer 220. As shown in FIG. 3E, in the present embodiment, the second substrate 200 of the present embodiment is exemplified by stacks of three second build-up layers 220 respectively disposed on two opposite surfaces of the second base 210, but the invention is not limited thereto. In other embodiments, the number of the second build-up layers 220 may be single or multiple layers, depending on the needs of the user. In other embodiments, the second build-up layers 220 may also be disposed only on one of the surfaces of the second base 210, and the invention is not limited thereto.

Referring to FIG. 3E, a plurality of conductive pads 240 are formed on the third surface 202 of the second substrate 200. In the present embodiment, the conductive pads 240 are electrically connected to the second circuit layer 224. In the present embodiment, the third surface 202 is exemplified by the uppermost surface of the second substrate 200, and the third surface 202 faces the first substrate 100 (shown in FIG. 4A). In the present embodiment, the material of the conductive pads 240 includes a metal material, which may be, for example, copper or the like.

In the present embodiment, the second build-up layers 220 are electrically connected to one another. In the present embodiment, the material of the second circuit layer 224 includes a metal material, which may be, for example, copper or the like. The material of the second dielectric layer 222 includes a dielectric material. The dielectric material is, for example, a PrePreg, a PID, a photosensitive polymer (for example, benzocyclobutene), an ABF film, an RCC, a glass fiber resin composite material, or a combination thereof, and the invention is not limited thereto.

Figure 4A:
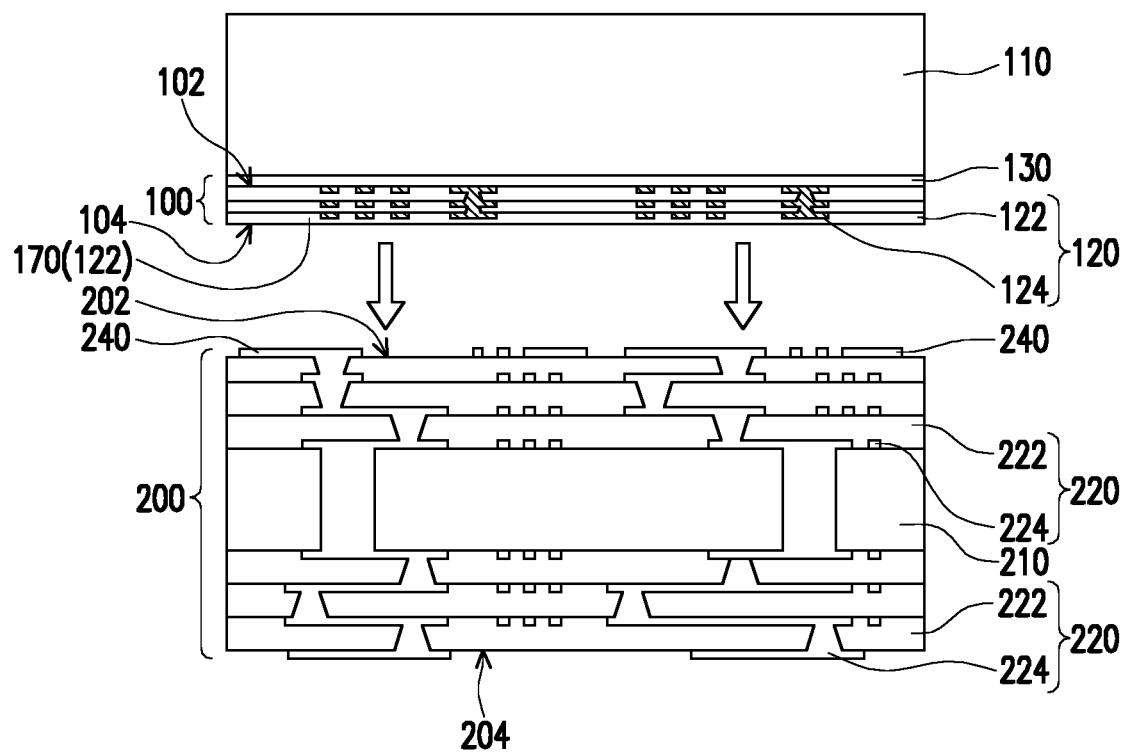
FIG. 4A to FIG. 4G are cross-sectional views of a manufacturing process of a circuit carrier board of an embodiment of the invention.

FIG. 4A to FIG. 4G are cross-sectional views of a manufacturing process of a circuit carrier board of an embodiment of the invention. Referring to FIG. 4A, after the step of forming the first substrate 100 and providing the second substrate 200, the second surface 104 of the first substrate 100 is then combined to the third surface 202 of the second substrate 200. Before the step of the above combination, in the present embodiment, the adhesive layer 170 is first used as the first dielectric layer 122 and disposed on the first substrate 100, but the invention is not limited thereto. In some embodiments, the adhesive layer 170 may be disposed on one of the first substrate 100 and the second substrate 200. For example, the adhesive layer may also be disposed on the second substrate 200 as the outermost second dielectric layer 222, but the invention is not limited thereto.

Figure 4B:
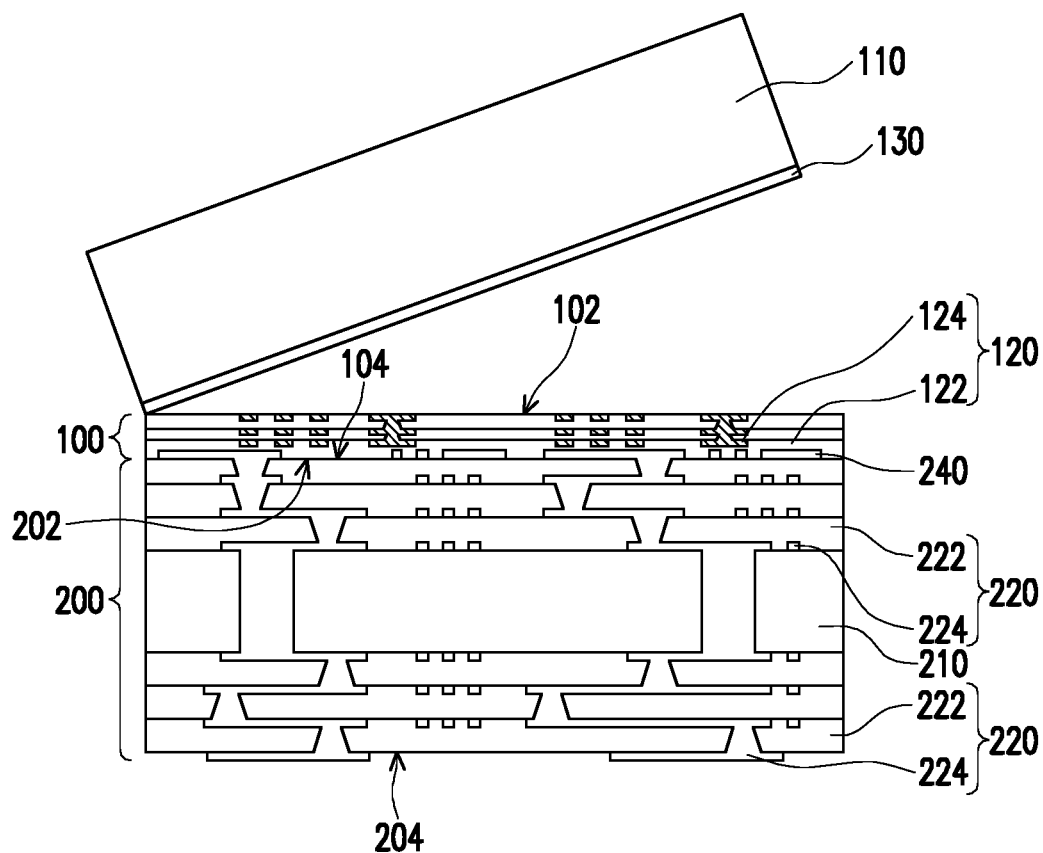

Next, referring to FIG. 4A and FIG. 4B, after the second surface 104 of the first substrate 100 is combined to the third surface 202 of the second substrate 200, the temporary substrate 110 and the release layer 130 formed on the temporary substrate 110 are removed. In the present embodiment, the first circuit layer 124 closest to the first surface 102 may be regarded as a bump structure, but the invention is not limited thereto. In other embodiments, the first circuit layer 124 may also be an under-bump metal (UBM) layer. In the present embodiment, the linewidth of the second circuit layer 224 is greater than the linewidth of the first circuit layer 124, and the linewidth of the second circuit layer is 10 microns to hundreds of microns, but the invention is not limited thereto.

It should be noted that in the invention, the first substrate 100 and the second substrate 200 may be formed separately, and then the first substrate 100 is combined to the second substrate 200. As a result, a plurality of build-up layers may be respectively disposed and formed in different substrates and combined into one. Therefore, the number of build-up layers formed on the same substrate may be reduced, the warpage issue caused by the manufacture of the plurality of build-up layers may be alleviated, manufacturing difficulty and manufacturing cost may be reduced, and production yield may be increased.

Figure 4C:
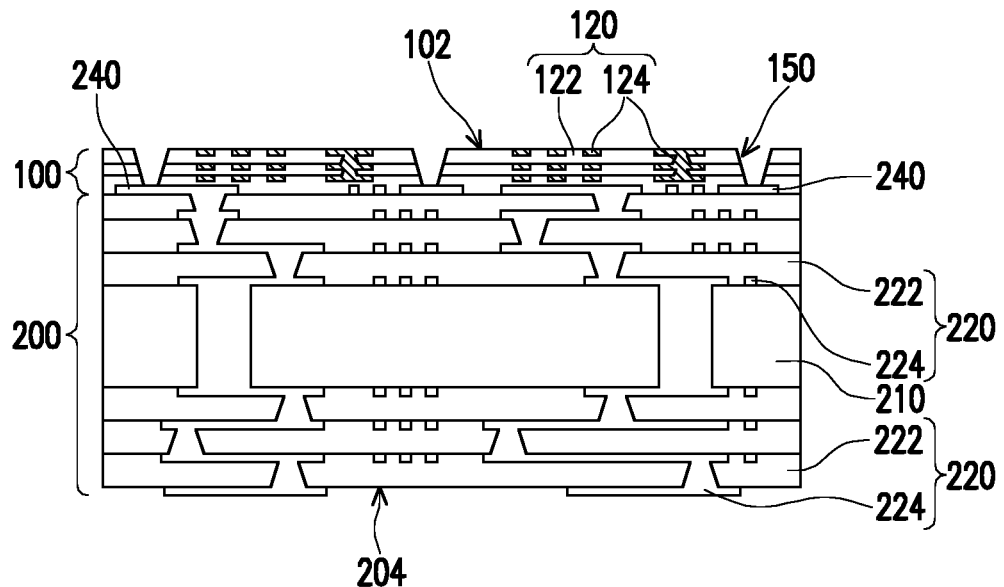

Referring to FIG. 4C, in the present embodiment, the manufacturing method of the circuit carrier board structure 1 further includes the following steps. After the temporary substrate 110 is removed, a plurality of through-holes 150 are formed, wherein the through-holes 150 pass through the first substrate 100 and expose the conductive pads 240. For example, the through-holes 150 are formed in the plurality of first build-up layers 120 and pass through the stack of the plurality of first build-up layers 120. In the present embodiment, the through-holes 150 may be formed by mechanical drilling, laser drilling, or other suitable methods, and the invention is not limited thereto. The cross section of the through-holes 150 is, for example, a taper-shaped cross section, but the invention is not limited thereto.

Figure 4D:
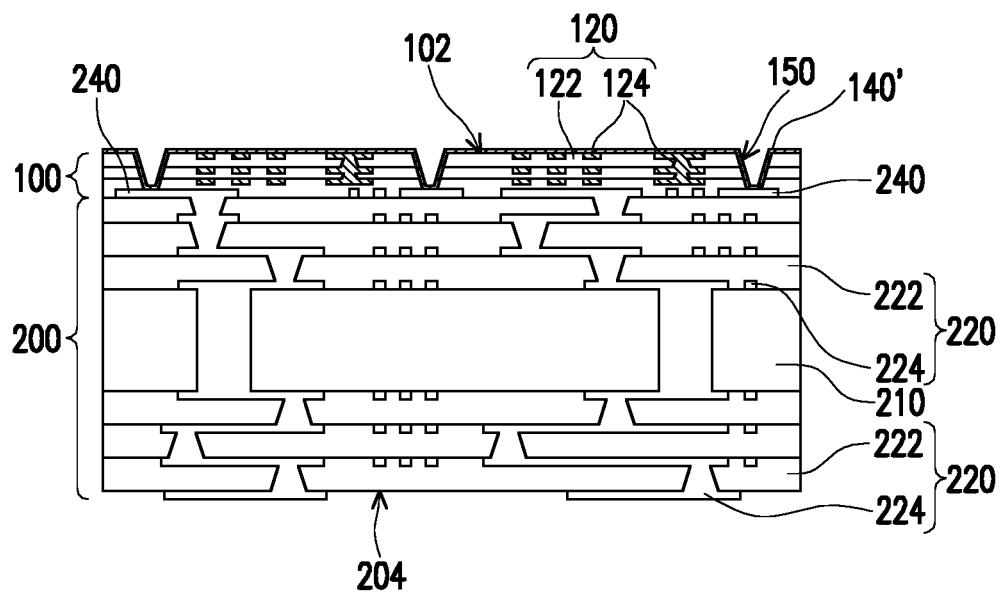

Next, referring to FIG. 4D, a seed layer 140' is formed on the first surface 102 of the first substrate 100, and the seed layer 140' is filled in the through-holes 150 and in contact with the conductive pads 240. For example, the seed layer 140' conformally covers the first surface 102 and the surface of the through-holes 150. In the present embodiment, the material of the seed layer 140' includes a metal material, which may be copper or titanium/copper. The forming method of the seed layer 140' includes electroless plating, sputtering, or a combination thereof, and the invention is not limited thereto.

Figure 4E:
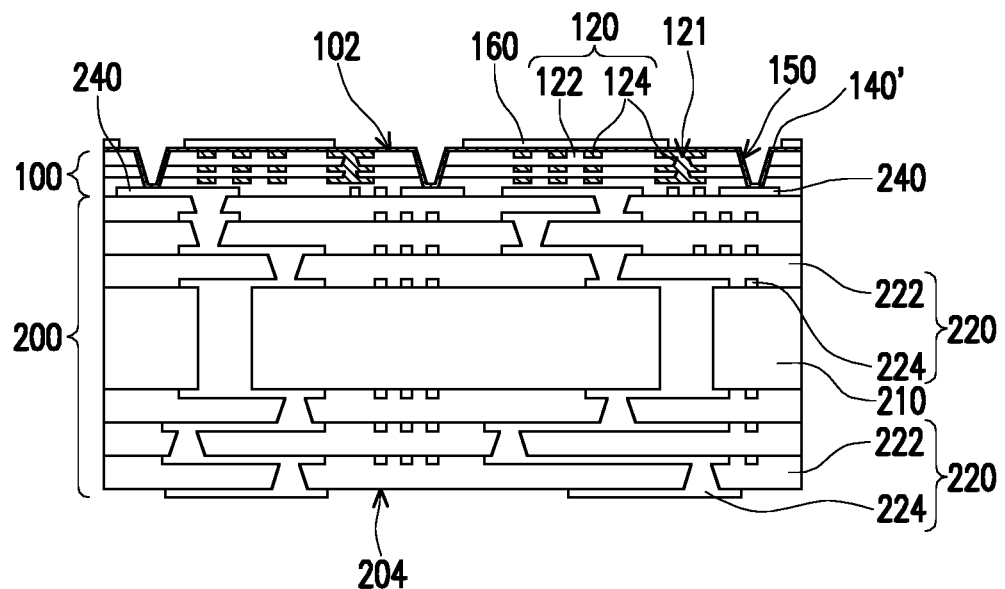

Next, referring to FIG. 4E, a photoresist pattern 160 is formed, wherein the photoresist pattern 160 covers a portion of the seed layer 140' to expose a portion of the seed layer 140'. For example, the photoresist pattern 160 exposes a portion of the seed layer 140' filled in the through-holes 150 and exposes the seed layer 140' partially covering the first circuit layer 124. In the present embodiment, the photoresist pattern 160 may be used to define the locations of subsequently formed conductive structures 140 (shown in FIG. 4F). The material of the photoresist pattern 160 includes a photosensitive dielectric material, polyimine, polybenzoxazole (PBO), silicone, epoxy resin, benzocyclobutene (BCB)) or other suitable materials, but the invention is not limited thereto.

Figure 4F:
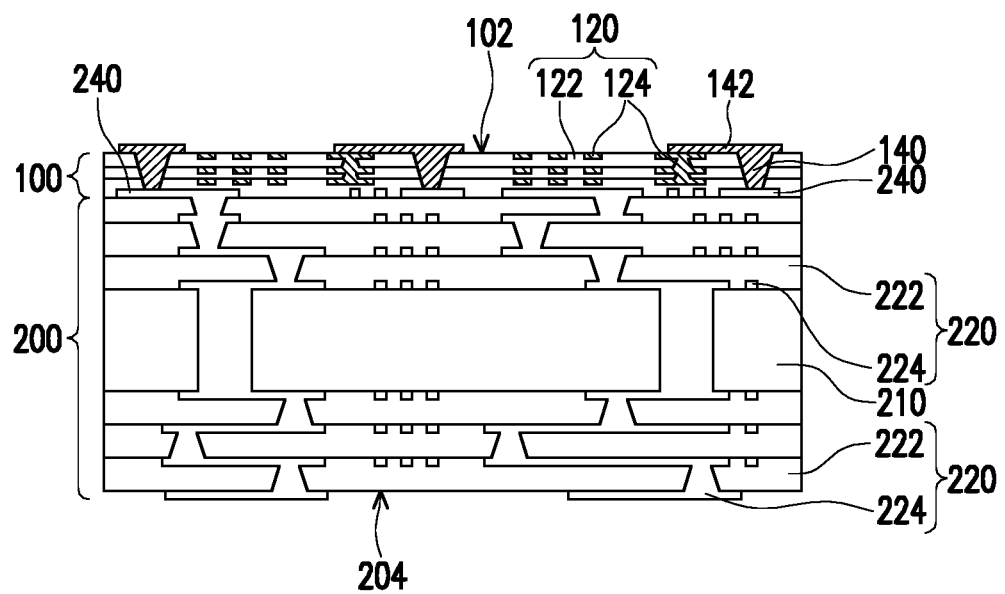

Next, referring to FIG. 4E and FIG. 4F, a plating process is performed to form a plurality of conductive structures 140 from the exposed portion of the seed layer 140'. For example, the conductive structures 140 may be formed in the through-holes 150 by electroplating or electroless plating. In other words, the conductive structures 140 are filled in the through-holes 150 and electrically connected to the conductive pads 240. Next, the photoresist pattern 160 and the seed layer 140' covered by the photoresist pattern 160 are removed.

In the present embodiment, before the photoresist pattern 160 is removed, a plurality of connection pads 142 are further formed on the first surface 102, and the connection pads 142 are electrically connected to the first circuit layer 124. In the present embodiment, the connection pads 142 and the conductive structures 140 are completed at the same time, but the invention is not limited thereto. For example, when the plurality of conductive structures 140 are formed, the partially exposed seed layer 140' on the first surface 102 may also be used to form the connection pads 142 on the first circuit layer 124 at the same time, and the connection pads 142 are electrically connected to the conductive structures 140. Therefore, the conductive structures 140 and the connection pads 142 may be formed at the same time in a single plating process and be regarded as an integrated structure. In the present embodiment, the conductive structures 140 are electrically connected to the conductive pads 240 and the first circuit layer 124. Since the first circuit layer 124 may be electrically connected to the conductive pads 240 and the second circuit layer 224 via the connection pads 142 and the conductive structures 140, the first substrate 100 is electrically connected to the second substrate 200.

In the present embodiment, a top surface 141 of the conductive structures 140 is different from the surface adjacent to a top surface 123 of the first circuit layer 124. For example, the top surface 141 of the conductive structures 140 is adjacent to the first surface 102, a bottom surface 143 of the conductive structures 140 is adjacent to the fourth surface 204, and the diameter of the top surface 141 of the conductive structures 140 is greater than the diameter of the bottom surface 143 of the conductive structures 140. The top surface 123 of the first circuit layer 124 is adjacent to the fourth surface 204, the bottom surface 121 of the first circuit layer 124 is adjacent to the first surface 102, and diameter of the top surface 123 of the first circuit layer 124 is greater than the diameter of the bottom surface 121 of the first circuit layer 124. The cross section of the conductive structures 140 is taper-shaped, but the invention is not limited thereto.

It should be noted that, in the invention, after the first substrate 100 is combined to the second substrate 200, the through-holes 150 may be formed on the first substrate 100 to dispose the conductive structures 140 and form the connection pads 142. Under the above configuration, in the invention, the ultrafine first circuit layer 124 may be manufactured first, and then the conductive structures 140 and the connection pads 142 having regular linewidth are manufactured. Therefore, in the invention, the first circuit layer 124, the conductive structures 140, and the connection pads 142 having different linewidths may be manufactured on the first substrate 100 in a simple process. For example, the linewidth of the first circuit layer 124 is smaller than the linewidth of the connection pads 142. Since the first substrate 100 may have both the first circuit layer 124 having ultrafine linewidth and the connection pads 140 having regular linewidth, the fine wiring requirement of bonding with the fine contacts on a chip (such as UBM) and the general wiring requirements for conducting the first substrate 100 and the second substrate 200 may be achieved without an additional interconnect structure. Therefore, the margin of the circuit layout is improved, such that the circuit carrier board structure 1 has good quality.

Figure 4G:
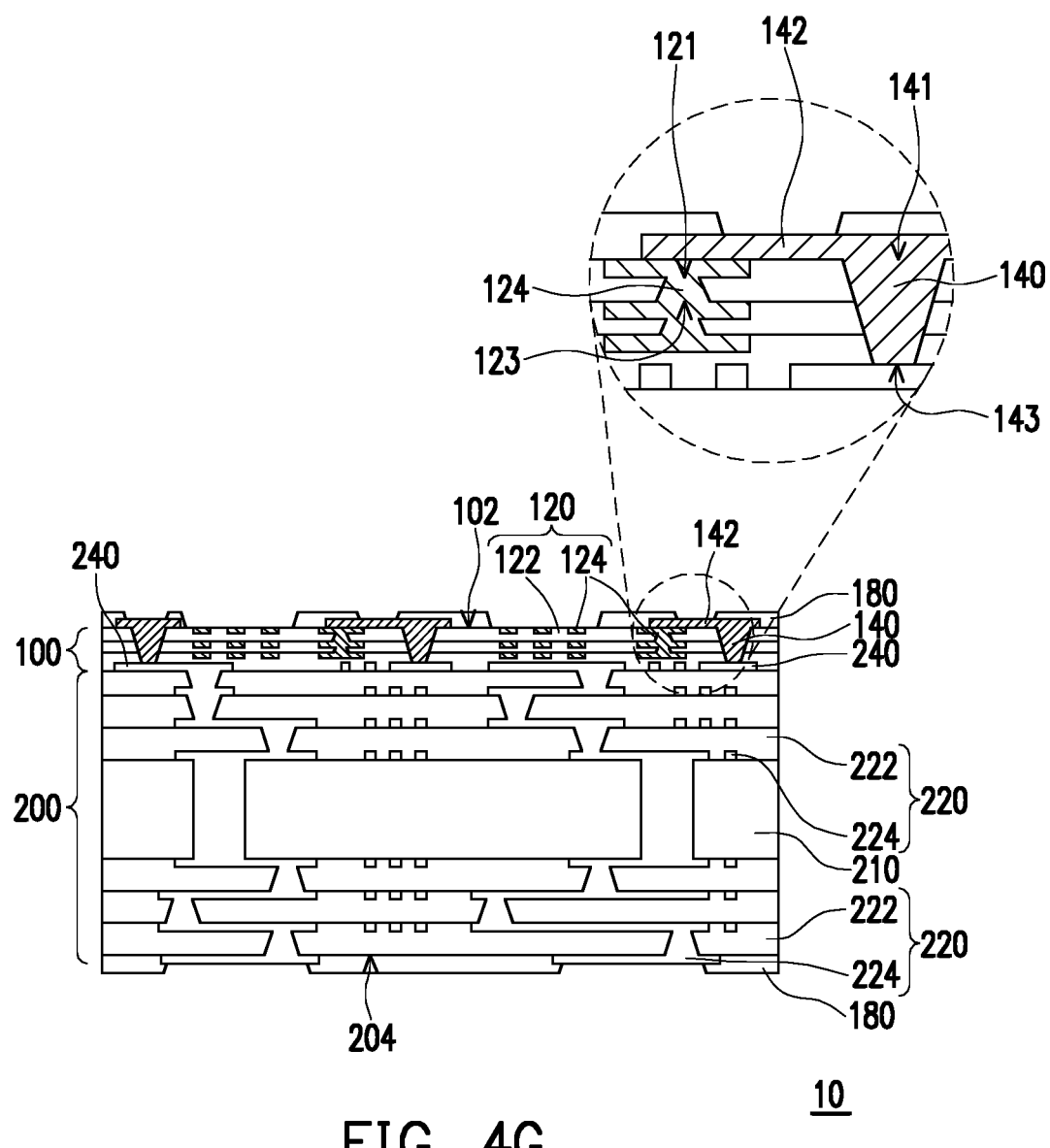

Next, referring further to FIG. 4G, a solder resist layer 180 is formed to cover the first surface 102 and the fourth surface 204. In the present embodiment, the solder resist layer 180 exposes a portion of the connection pads 142, the first circuit layer 124, and the second circuit layer 224. The material of the solder resist layer 180 includes green paint, a photosensitive dielectric material, an ABF film, and a polymer resin material, and the invention is not limited thereto.

Next, in the present embodiment, a surface treatment procedure is optionally performed. The surface treatment procedure includes electroless nickel/electroless palladium/immersion gold (ENEPIG), electroless nickel autocatalytic gold (ENAG), immersion tin (IT), micro-ball, and 305 tin-silver-copper alloy tin paste (SAC 305). At this point, the manufacture of the circuit carrier board 10 of the invention is completed.

Then, referring to FIG. 1 and FIG. 4G, a plurality of electronic elements 500 are disposed on the first surface 102 of the first substrate 100. The electronic elements 500 are electrically connected to the connection pads 142 and the first circuit layer 124. Lastly, a plurality of solder balls SB are disposed on the solder resist layer 180, wherein the solder balls SB are electrically connected to the second circuit layer 224. At this point, the manufacture of the circuit carrier board structure 1 is completed. In the present embodiment, the electronic elements 500 are exemplified by chips, and have contacts having fine linewidth and contacts having general linewidth (not labeled) respectively electrically connected to the first circuit layer 124 and the connection pads 142. With the above configuration, the circuit carrier board 10 of the invention may achieve bonding with the fine contacts on the chips without the need for an additional interconnect structure. The plurality of electronic elements 500 may be electrically connected to one another via the first substrate 100, and may be electrically connected to the second substrate 200 via the conductive structures 140, thereby improving the wiring margin of the circuit carrier board structure 1, and further improving the signal integrity of signal transmission between the plurality of electronic elements 500.

In short, in the circuit carrier board structure 1 of the invention, the plurality of first build-up layers 120 and second build-up layers 220 are respectively disposed in the first substrate 100 and the second substrate 200. Therefore, the number of build-up layers formed on the same substrate may be reduced, the warpage issue caused by the manufacture of the plurality of build-up layers may be alleviated, manufacturing difficulty and manufacturing cost may be reduced, and production yield may be increased. In addition, in the circuit carrier board structure 1 of the invention, the conductive structures 140 and the connection pads 142 may be further disposed on the first substrate 100 after the first substrate 100 is combined to the second substrate 200 to electrically connect the first substrate 100 and the second substrate 200. As a result, the circuit carrier board structure 1 may be electrically connected to the electronic elements 500 (such as chips) via the ultrafine first circuit layer 124 of the first substrate 100 and the connection pads 142 without an additional interconnect structure. Accordingly, the circuit carrier board structure 1 not only may achieve the requirement of fine contact bonding with the electronic elements 500, but may be further electrically connected to the second substrate 200 via the first substrate 100 comprehensively disposed on the second substrate 200 and the conductive structures 140 disposed in the first substrate 100. Therefore, the wiring margin of the circuit carrier board structure 1 may be greatly improved, and the signal integrity of the signal transmission between the plurality of electronic elements 500 may also be improved, such that the circuit carrier board structure 1 has good quality.

It should be mentioned here that, the following embodiments adopt the reference numerals of the embodiments above and a portion of the content thereof, wherein the same reference numerals are adopted to represent the same or similar elements. Descriptions of the same technical content omitted are as provided in the embodiments above and are not repeated in the following embodiments.

Figure 5A:
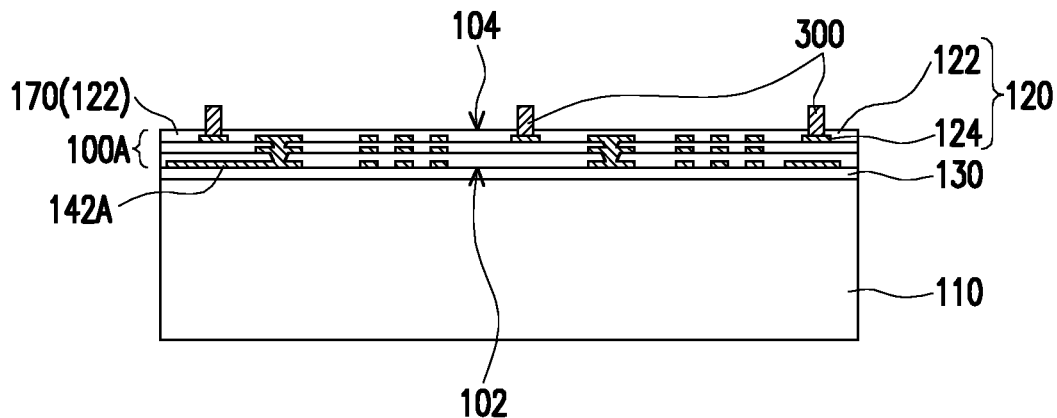
FIG. 5A to FIG. 5D are cross-sectional views of a manufacturing process of a circuit carrier board of another embodiment of the invention.
Figure 5B:
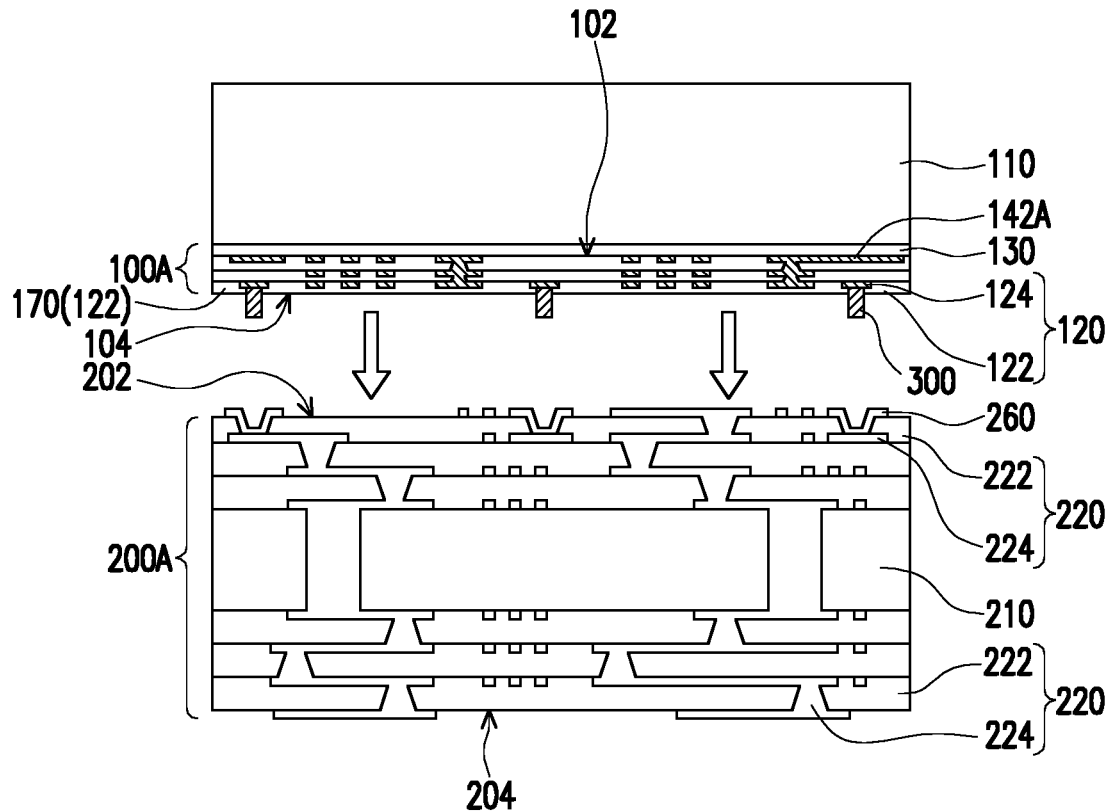
Figure 5C:
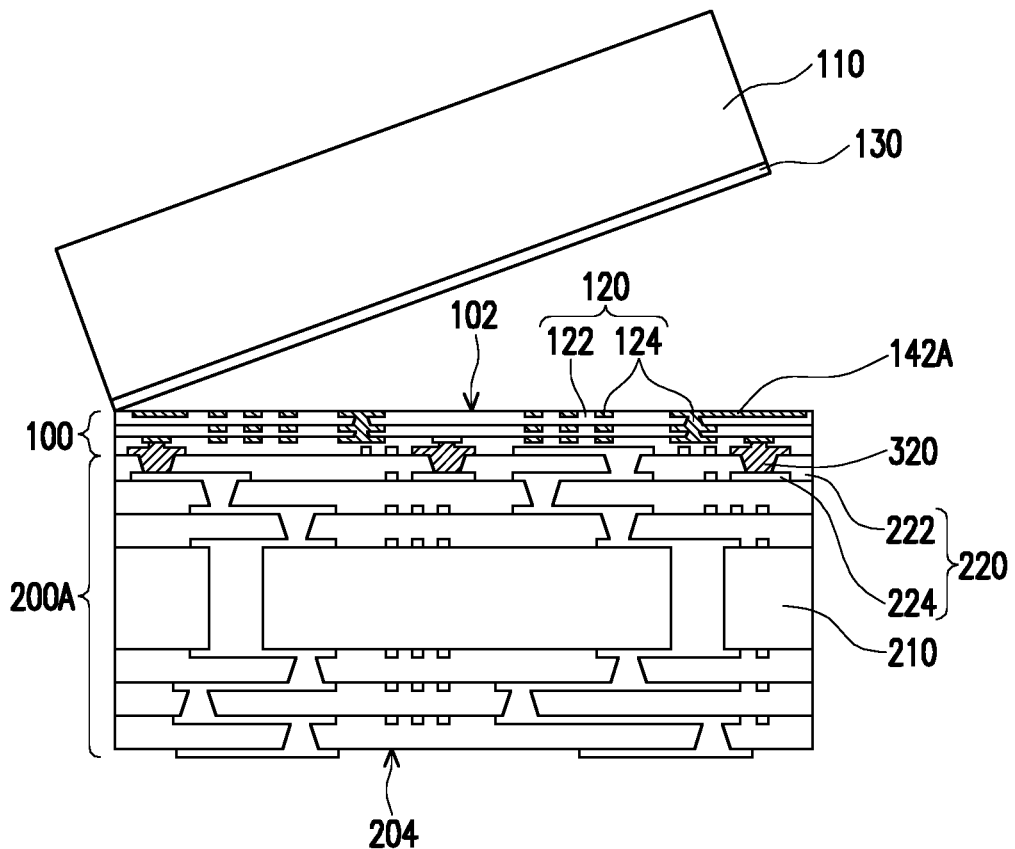
Figure 5D:
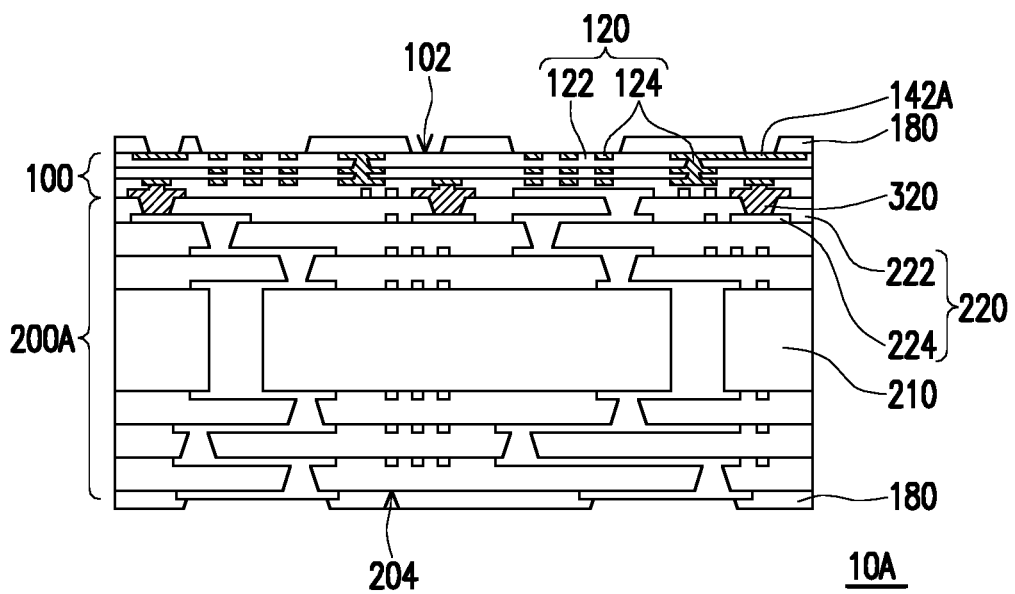

FIG. 5A to FIG. 5D are cross-sectional views of a manufacturing process of a circuit carrier board of another embodiment of the invention. Referring first to FIG. 4G and FIG. 5D, a circuit carrier board 10A of the present embodiment is similar to the circuit substrate 10 of FIG. 4G. The main difference is that a first substrate 100A of the circuit carrier board 10A further includes a plurality of conductive pillars 300 and a second substrate 200A further includes a plurality of conductive blind vias 260. The conductive pillars 300 are filled in the conductive blind vias 260 to form conductive structures 320, and the conductive structures 320 are electrically connected to the first circuit layer 124 and the second circuit layer 224. The manufacturing method of the circuit carrier board 10A is described below with an embodiment.

Referring to FIG. 5A, a plurality of conductive pillars 300 are formed on the second surface 104 and electrically connected to the first circuit layer 124. The method of forming the conductive pillars 300 includes forming the conductive pillars 300 on the first circuit layer 124 by, for example, a plating process. The material of the conductive pillars 300 and the first circuit layer 124 includes a metal material, which may be, for example, copper or the like. In the present embodiment, the plurality of conductive pillars 300 are separated from one another and have a pillar shaped cross section. In the present embodiment, when the first build-up layer 120 closest to the temporary carrier board 110 is formed, the first circuit layer 124 and connection pads 142A may be formed at the same time. For example, the first circuit layer 124 and the connection pads 142A may actually be integrally formed, but the invention is not limited thereto. In other embodiments, the connection pads 142A may also be formed after the temporary carrier board 110 is removed.

Next, referring to FIG. 5B, a plurality of conductive blind vias 260 are formed on the third surface 104 and electrically connected to the second circuit layer 224. The material of the conductive blind vias 260 includes a metal material, which may be copper or titanium/copper. The forming method of the conductive blind vias 260 includes electroless plating, sputtering, or a combination thereof, and the invention is not limited thereto.

Next, referring to FIG. 5B and FIG. 5C, the first substrate 100A is combined to the second substrate 200A. Then, the temporary substrate 110 and the release layer 130 formed on the temporary substrate 110 are removed. Then, referring to FIG. 5D, a solder resist layer 180 is formed to cover the first surface 102 and the fourth surface 104 and expose the connection pads 142A, the first circuit layer 124, and the second circuit layer 224. Therefore, in the subsequent process of disposing the electronic elements and the solder balls (shown in FIG. 1), the electronic elements may be directly electrically connected to the first circuit layer 124, and the solder balls are electrically connected to the second circuit layer 224 to reduce manufacturing difficulty and manufacturing cost and increase production yield.

It should be noted that the step of combining the first substrate 100A to the second substrate 200A includes combining the conductive pillars 300 to the conductive blind vias 260 via a certain temperature and pressure, such that the conductive pillars 300 are electrically connected to and filled in the conductive blind vias 260 to form the conductive structures 320. In the present embodiment, the temperature and pressure of the combining step may be adjusted depending on the material or process requirements. In the present embodiment, the conductive pillars 300 and the conductive blind vias 260 are made of the same material. For example, the material of the conductive pillars 300 and the material of the conductive blind vias 260 are both metal copper. Therefore, in the present embodiment, the first substrate 100A and the second substrate 200A may be bonded together via copper-to-copper bonding to form the circuit carrier board 10A.

In the present embodiment, the cross section of the conductive structures 320 is taper or pillar shaped, but the invention is not limited thereto. For example, the diameter of the top surface (not labeled) of the conductive structure 320 adjacent to the first surface 102 may be greater than or equal to the diameter of the bottom surface (not labeled) adjacent to the fourth surface 204. Therefore, the conductive structures 320 may be formed into a tapered shape in which the diameter of the bottom surface is smaller than the diameter of the top surface or a pillar shape in which the diameters of the bottom surface and the top surface are the same. Therefore, the conductive structures 320 may be electrically connected to the second circuit layer 224 and the first circuit layer, thereby providing good bonding reliability and quality, reducing manufacturing difficulty and manufacturing cost, and improving production yield. In addition, via the above design, the circuit carrier board 10A of the present embodiment may also achieve the same effects as the above embodiments, and details are not repeated herein.

Figure 6A:
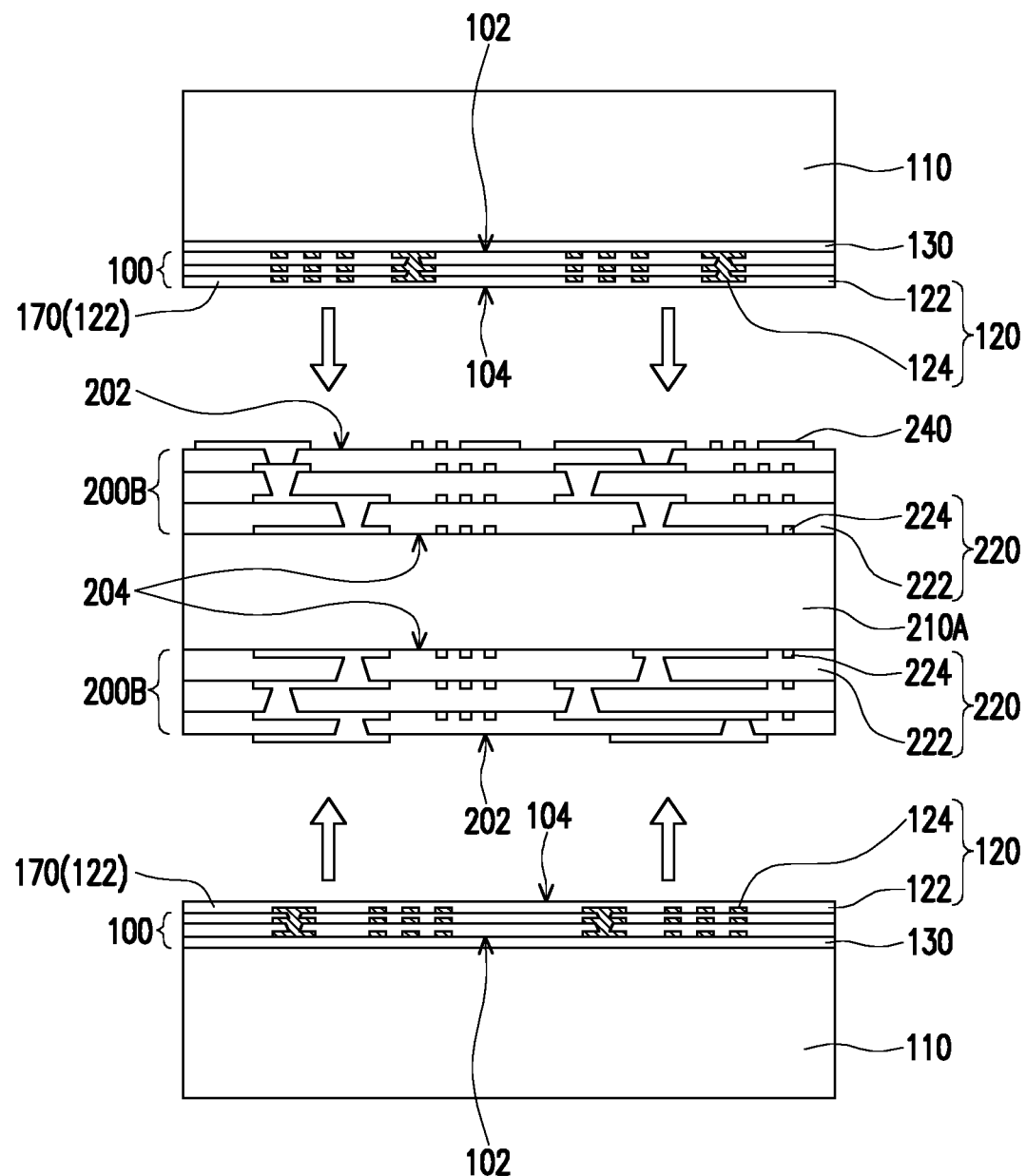
FIG. 6A to FIG. 6H are cross-sectional views of a manufacturing process of a circuit carrier board of another embodiment of the invention.
Figure 6B:
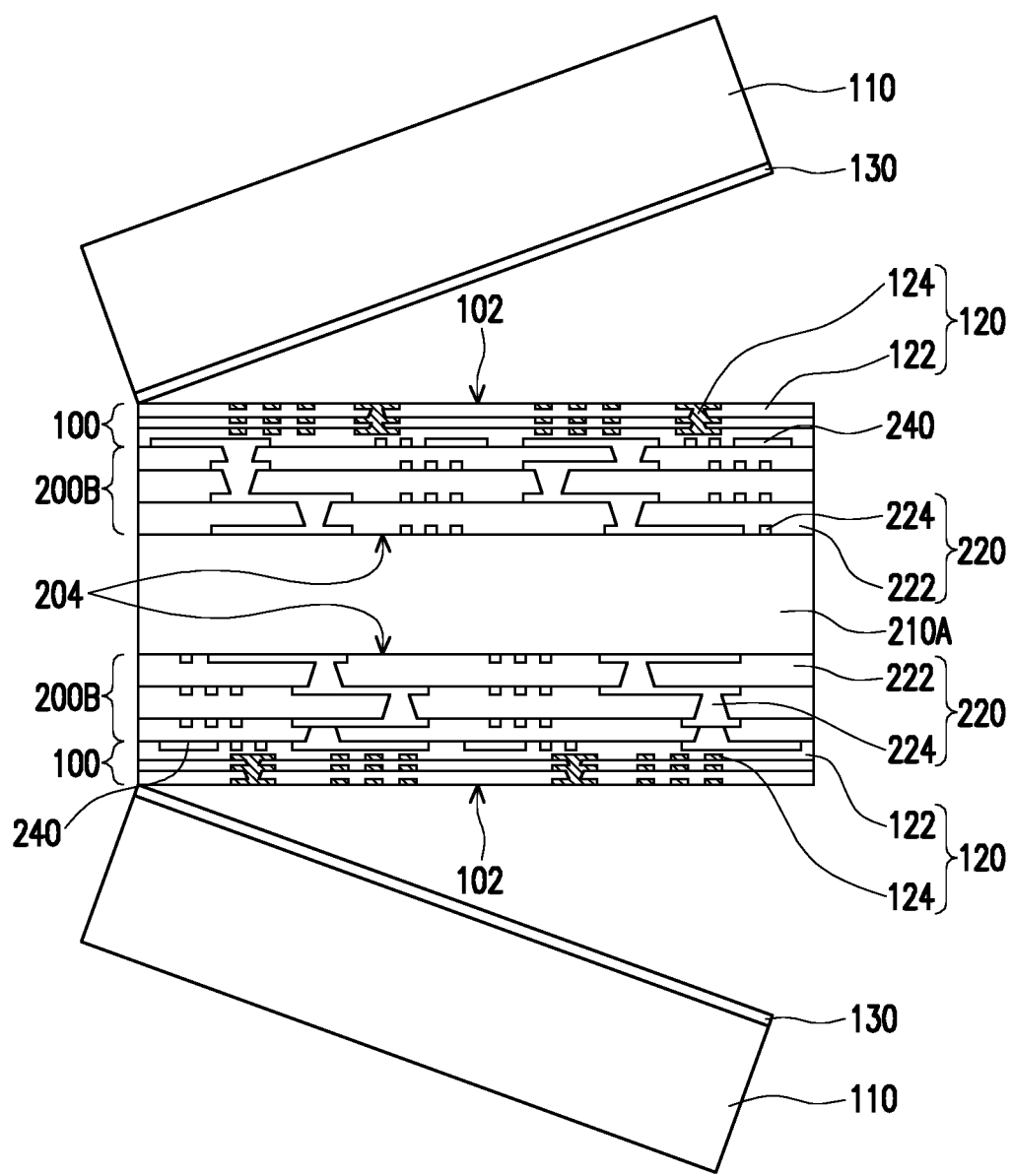
Figure 6C:
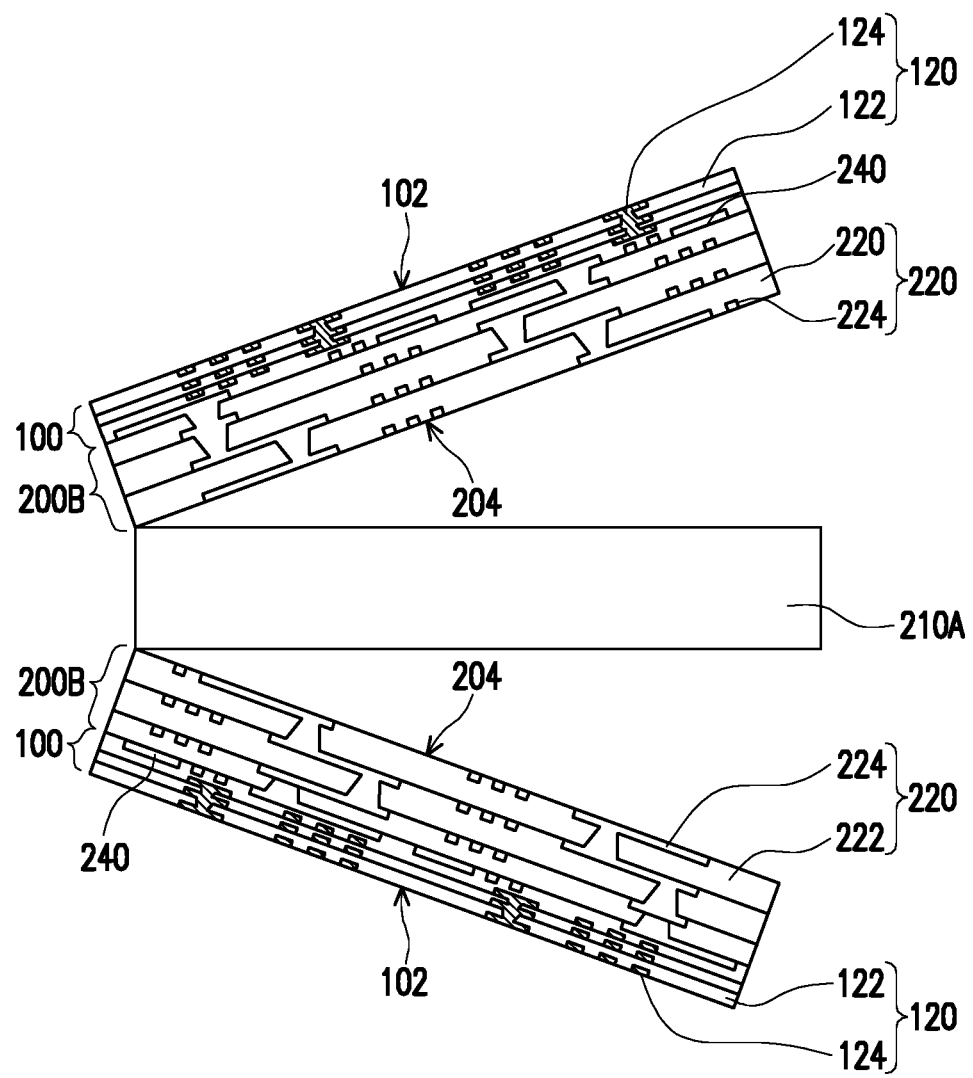
Figure 6D:
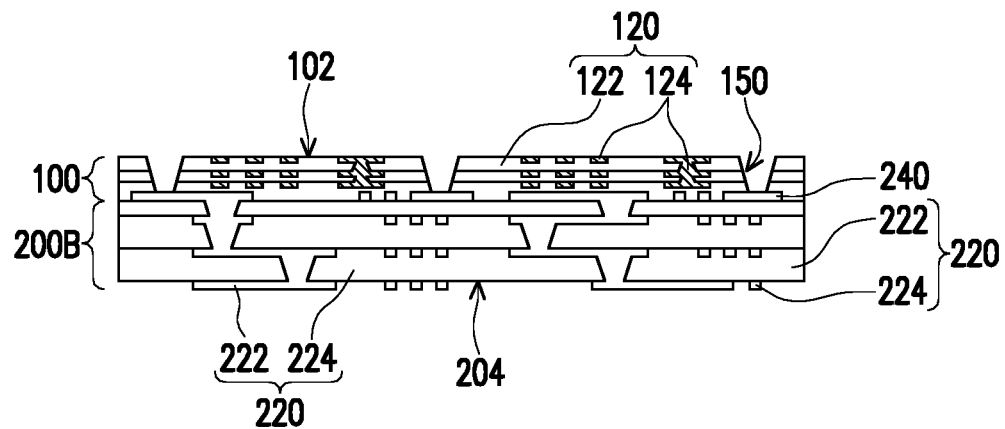
Figure 6E:
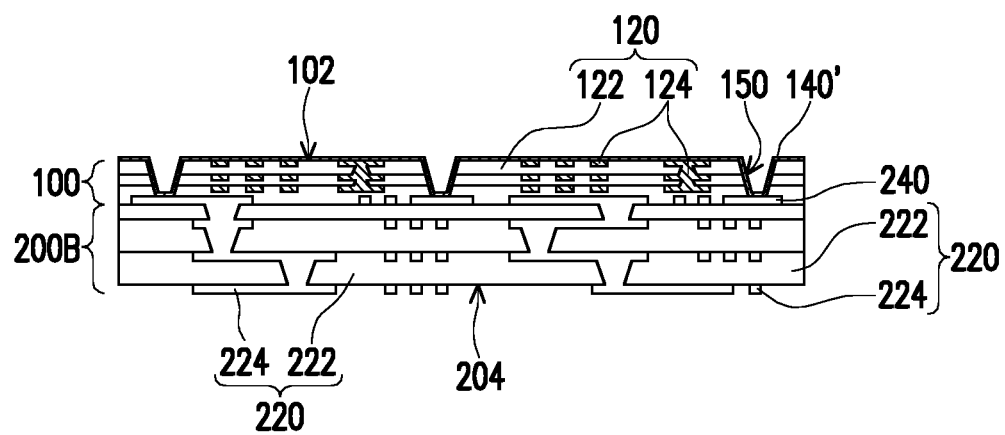
Figure 6F:
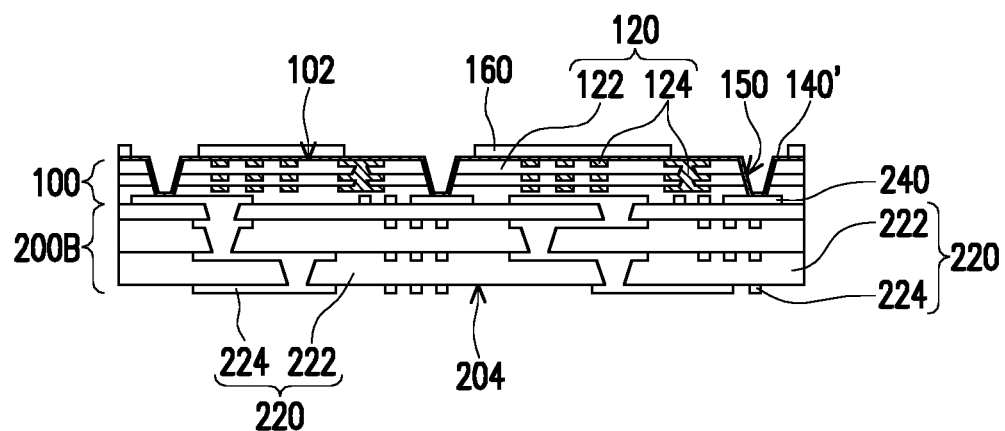
Figure 6G:
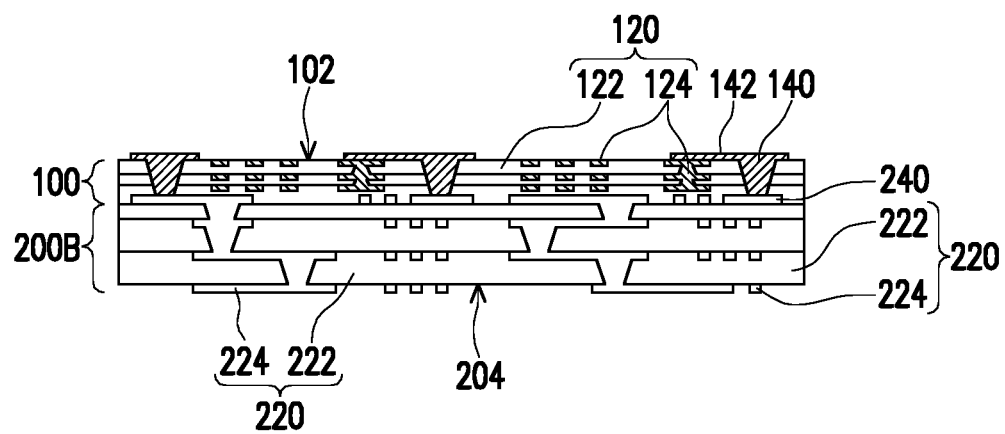
Figure 6H:
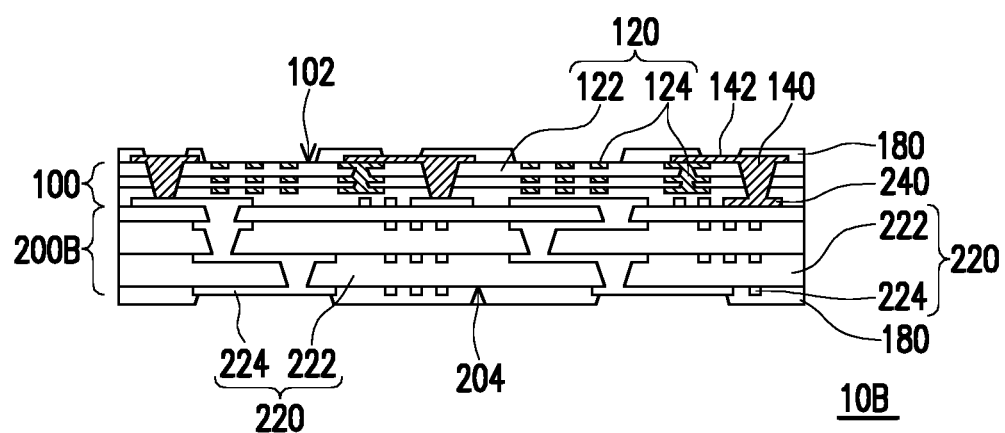

FIG. 6A to FIG. 6H are cross-sectional views of a manufacturing process of a circuit carrier board of another embodiment of the invention. Referring to FIGS. 4G and 6H first, a circuit carrier board 10B of the present embodiment is similar to the circuit substrate 10 of FIG. 4G. The main difference is that a second substrate 200B of the present embodiment does not include a second base. Specifically, the second substrate 200B of the present embodiment is exemplified by a coreless substrate.

Referring to FIG. 4A and FIG. 6A, the first substrate 100 of the present embodiment is the same as the first substrate 100 of FIG. 4A and details are not repeated herein. The second substrate 200B includes a plurality of second build-up layers 22 sequentially stacked and disposed on two opposite surfaces of a second base 210A. For example, the fourth surfaces 204 of the two upper and lower substrates 200B are disposed on two opposite surfaces of the second base 210A. The material of the second base 210A may include glass, ceramic, polymer material, flexible dielectric material, or other suitable materials, and the invention is not limited thereto. In other embodiments, the material of the second base 210A may also include a PrePreg.

Next, as shown in FIG. 6A, the second surfaces 104 of the upper and lower first substrates 100 are respectively combined to the third surfaces 202 of the upper and lower two substrates 200B. Then, referring to FIG. 6B, the temporary carrier board 110 is removed. Detailed bonding and removal steps are described in the above paragraphs and are repeated herein.

Next, referring to FIG. 6C, the second base 210A is removed to obtain two coreless second substrates 200B. As a result, manufacturing efficiency may be increased, cost may be reduced, and production yield may be improved.

Next, referring to FIG. 6D, FIG. 6E, FIG. 6F, FIG. 6G, and FIG. 6H, a plurality of conductive structures 140 are formed, wherein the conductive structures 140 are filled in the through-holes 150 and electrically connected to the connection pads 142, the conductive pads 240, the first circuit layer 120, and the second circuit layer 220. Detailed forming steps are described in the above paragraphs and are repeated herein. Therefore, the first substrate 100 of the circuit carrier board 10B may be electrically connected to the second substrate 200B and achieve the same effect as the above embodiments.

Figure 7:
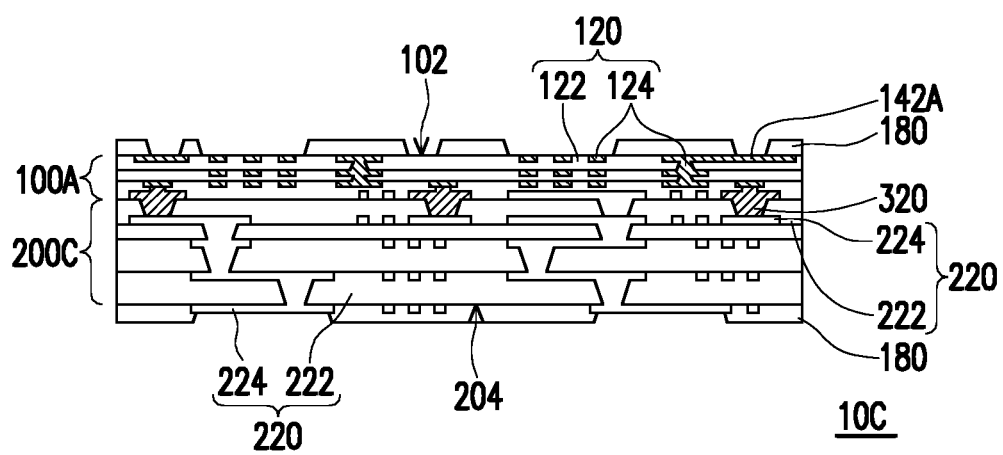
FIG. 7 is a cross-sectional view of a circuit carrier board of another embodiment of the invention.

FIG. 7 is a cross-sectional view of a circuit carrier board of another embodiment of the invention. Referring to FIG. 6H and FIG. 7, a circuit carrier board 10C of the present embodiment is similar to the circuit board 10B of FIG. 6H. The main difference is that the first substrate 100A of the present embodiment is combined to a second substrate 200C, such that the conductive pillars are filled in the conductive blind vias (shown in FIG. 5B) to form the conductive structures 320, and the conductive structures 320 are electrically connected to the first circuit layer 124 and the second circuit layer 224. Detailed combining steps are described in the above paragraphs and are repeated herein. Therefore, the first substrate 100A of the circuit carrier board 10C may be electrically connected to the second substrate 200C and achieve the same effect as the above embodiments.

Figure 8A:
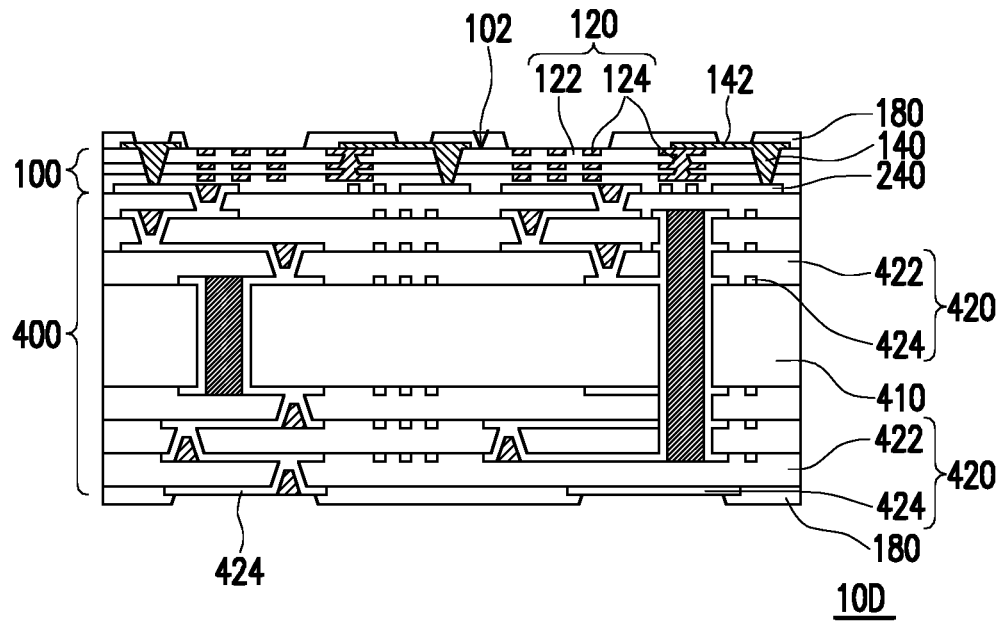
FIG. 8A is a cross-sectional view of a manufacturing process of a circuit carrier board of another embodiment of the invention.

FIG. 8A is a cross-sectional view of a manufacturing process of a circuit carrier board of another embodiment of the invention. Referring to FIG. 4G and FIG. 8A, a circuit carrier board 10D of the present embodiment is similar to the circuit substrate 10 of FIG. 4G. The main difference is that the second substrate 400 of the present embodiment is a printed circuit board. Specifically, the second substrate 400 includes a second base 410 and a plurality of second build-up layers 420 sequentially stacked on the second base 410. The second build-up layers 420 include a second dielectric layer 422 and a second circuit layer 424, and the second build-up layers 420 are electrically connected to one another. The first substrate 100 is disposed on the second substrate 400 and the first substrate 100 is electrically connected to the second substrate 400. Detailed forming steps are described in the above paragraphs and are not repeated herein. Therefore, the first substrate 100 of the circuit carrier board 10D may be electrically connected to the second substrate 400 and achieve the same effect as the above embodiments. In the present embodiment, the second substrate 400 is exemplified by a printed circuit board, but the invention is not limited thereto. In other embodiments, the second substrate may also be an any-layer printed circuit board.

Figure 8B:
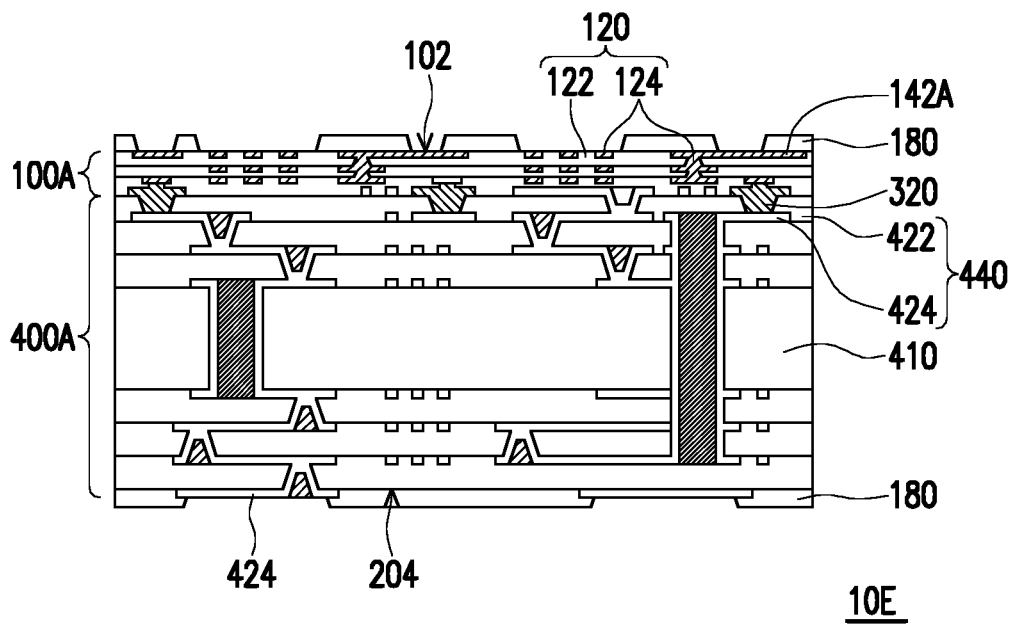
FIG. 8B is a cross-sectional view of a manufacturing process of a circuit carrier board of yet another embodiment of the invention.

FIG. 8B is a cross section of a manufacturing process of a circuit carrier board of yet another embodiment of the invention. Referring to FIGS. 8A and 8B, a circuit carrier board 10E of the present embodiment is similar to the circuit board 10D of FIG. 8A. The main difference is that the first substrate 100A of the present embodiment is combined to a second substrate 400A, such that the conductive pillars are filled in the conductive blind vias (shown in FIG. 5B) to form the conductive structures 320, and the conductive structures 320 are electrically connected to the first circuit layer 124 and the second circuit layer 424. Detailed combining steps are described in the above paragraphs and are not repeated herein. Therefore, the first substrate 100A of the circuit carrier board 10D may be electrically connected to the second substrate 400A and achieve the same effect as the above embodiments. In the present embodiment, the second substrate 400A is exemplified by a printed circuit board, but the invention is not limited thereto. In other embodiments, the second substrate may also be an any-layer printed circuit board.

Based on the above, in the circuit carrier board structure and the manufacturing method thereof of the invention, the plurality of first build-up layers and second build-up layer are respectively disposed in the first substrate and the second substrate. Therefore, the number of build-up layers formed on the same substrate may be reduced, the warpage issue caused by the manufacture of the plurality of build-up layers may be alleviated, manufacturing difficulty and manufacturing cost may be reduced, and production yield may be increased. In addition, the circuit carrier board structure of the invention may further be electrically connected to the first substrate and the second substrate via the conductive structures and the connection pads. As a result, the circuit carrier board structure may be electrically connected to the electronic elements (such as chips) via the ultrafine first circuit layer of the first substrate and the connection pads without an additional interconnect structure. Accordingly, the circuit carrier board structure not only may achieve the requirement of fine contact bonding with the electronic elements, but may be further electrically connected to the second substrate via the first substrate comprehensively disposed on the second substrate and the conductive structures disposed in the first substrate. Therefore, the wiring margin of the circuit carrier board structure may be greatly improved, and the signal integrity of the signal transmission between the plurality of electronic elements may also be improved, such that the circuit carrier board structure has good quality. In addition, the circuit carrier board structure may further include conductive structures formed by copper-to-copper bonding of the conductive pillars and the conductive blind vias. As a result, good bonding reliability and quality may be further provided to reduce manufacturing difficulty and manufacturing cost and improve production yield. In addition, the manufacturing method of the circuit carrier board structure of the invention may be applied to high-density connection boards, coreless substrates, printed circuit boards, or any-layer printed circuit boards, and has excellent applicability.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit carrier board structure, comprising:
    a first substrate having a first surface and a second surface opposite to the first surface, comprising:
        a plurality of first build-up layers that are sequentially stacked, wherein each of the first build-up layers comprises a first dielectric layer and a first circuit layer, and the first build-up layers are electrically connected to one another;
    a second substrate having a third surface and a fourth surface opposite to the third surface, comprising:
        a plurality of second build-up layers that are sequentially stacked, wherein each of the second build-up layers comprises a second dielectric layer and a second circuit layer, and the second build-up layers are electrically connected to one another;
    an adhesive layer located between the first substrate and the second substrate, wherein the second surface is combined to the third surface; and
    a plurality of connection pads located on the first surface and electrically connected to the first circuit layer,
    wherein the first substrate is electrically connected to the second substrate,
    wherein a linewidth of the first circuit layer is smaller than a linewidth of each of the connection pads,
    wherein the linewidth of the first circuit layer is less than or equal to 10 microns.

2. The circuit carrier board structure of claim 1, wherein the first substrate further comprises a plurality of through-holes passing through the first substrate, the second substrate further comprises a second base and the second build-up layers are disposed on the second base, a plurality of conductive pads are located on the third surface and electrically connected to the second circuit layer, the through-holes expose the conductive pads, and a plurality of conductive structures are filled in the through-holes and electrically connected to the connection pads, the conductive pads, the first circuit layer, and the second circuit layer.

3. The circuit carrier board structure of claim 2, wherein a top surface of each of the conductive structures is adjacent to the first surface, a bottom surface of each of the conductive structures is adjacent to the second surface, and a diameter of the top surface of each of the conductive structures is greater than a diameter of the bottom surface of each of the conductive structures,
    wherein a top surface of the first circuit layer is adjacent to the second surface, a bottom surface of the first circuit layer is adjacent to the first surface, and a diameter of the top surface of the first circuit layer is greater than a diameter of the bottom surface of the first circuit layer.

4. The circuit carrier board structure of claim 3, wherein each of the conductive structures has a taper-shaped cross section.

5. The circuit carrier board structure of claim 2,
    wherein the second base comprises a core substrate or a coreless substrate.

6. The circuit carrier board structure of claim 1, wherein the first substrate further comprises a plurality of conductive pillars located on the second surface and electrically connected to the first circuit layer, the second substrate further comprises a second base and the second build-up layers are disposed on the second base, a plurality of conductive blind vias are located on the third surface and electrically connected to the second circuit layer, the conductive pillars are filled in the conductive blind vias to form a plurality of conductive structures, and the conductive structures are electrically connected to the first circuit layer and the second circuit layer.

7. The circuit carrier board structure of claim 6, wherein each of the conductive structures has a taper or pillar shaped cross section.

8. The circuit carrier board structure of claim 1, further comprising:
    a solder resist layer covering the first surface and the fourth surface, wherein the solder resist layer exposes a portion of the connection pads, the first circuit layer, and the second circuit layer.

9. The circuit carrier board structure of claim 1, further comprising:
    a plurality of electronic elements located on the first surface of the first substrate, wherein the electronic elements are electrically connected to the connection pads and the first circuit layer; and
    a plurality of solder balls electrically connected to the second circuit layer.

10. The circuit carrier board structure of claim 1, wherein the first circuit layer is embedded in the first dielectric layer, and the second circuit layer is embedded in the second dielectric layer.

11. The circuit carrier board structure of claim 1, wherein a material of the first dielectric layer, the second dielectric layer, and the adhesive layer comprises one of a PrePreg, a flame-resistant glass fiber, a resin-coated cooper foil, an Ajinomoto Build-up (ABF) film, an adhesive, a solder resist material, or a photosensitive dielectric material.

12. The circuit carrier board structure of claim 1, wherein the linewidth of the second circuit layer is greater than the linewidth of the first circuit layer.

* * * * *